(12) United States Patent
Harris et al.

(10) Patent No.: US 6,307,903 B1
(45) Date of Patent: Oct. 23, 2001

(54) LOW PASS DIGITAL FILTER IMPLEMENTED IN A MODEM OF A TELEVISION SYSTEM

(75) Inventors: Fred Harris, Lemon Grove; Vlad Bril, Campbell, both of CA (US)

(73) Assignee: Telecruz Technology, Inc., San Jose, CA (US)

(*) Notice: Subject to any disclaimer, the term of this patent is extended or adjusted under 35 U.S.C. 154(b) by 0 days.

(21) Appl. No.: 09/360,600

(22) Filed: Jul. 26, 1999

(51) Int. Cl.$^7$ ...................................................... H04B 1/10
(52) U.S. Cl. ........................................... 375/350; 708/322
(58) Field of Search ..................... 375/229, 296, 375/252, 284, 350, 254; 708/290, 300, 306, 313, 314, 319, 320, 322, 323, 672, 847; 340/143, 142, 126; 344/50, 61

(56) References Cited

U.S. PATENT DOCUMENTS

| | | | |
|---|---|---|---|
| 5,309,484 | * 5/1994 | McLane et al. | 375/354 |
| 5,325,318 | * 6/1994 | Harris et al. | 708/313 |
| 5,561,424 | * 10/1996 | Norsworthy et al. | 341/126 |
| 5,731,769 | * 3/1998 | Girardeau, Jr. et al. | 341/61 |
| 5,742,527 | * 4/1998 | Rybicki et al. | 708/109 |
| 5,917,809 | * 6/1999 | Ribner et al. | 370/286 |
| 5,987,145 | * 11/1999 | Lawton | 381/103 |
| 5,995,539 | * 11/1999 | Miller | 375/222 |
| 6,028,890 | * 2/2000 | Salami et al. | 375/216 |
| 6,044,083 | * 3/2000 | Citta et al. | 370/441 |
| 6,081,216 | * 6/2000 | May | 341/143 |
| 6,195,383 | * 2/2001 | Wishart et al. | 375/136 |
| 6,208,671 | * 3/2001 | Paulos et al. | 370/545 |

OTHER PUBLICATIONS

Fred Harris and Bill McKnight, Entitled "Oversampled Digital To Analog Converters With Very Small Computational Load", 25th Annual Asilomar Conference on Signals, Systems, and Computers, Pacific Grove, CA., Nov. 4–6, 1991, Conference Record Twenty–Fifth Asilomar Conference on Signals, Systems & Computers, vol. 2 of 2, pp. 1031–1036, ISBN 0–8186–2470–1, IEEE catalog No. 91CH3112–0, (5 pages).

Fred Harris, Entitled "On The Design And Performance Of Efficient And Novel Filter Structures Using Recursive All-pass Filters" Keynote Presentation ISSPA–92 (International Symposium on Signal Processing), Gold Coast, Australia, Aug. 16–21, 1992 (6 pages).

Fred Harris, Electrical and Computer Engineering, San Diego State Unversity, San Diego, California 92182–0190, USA and Itzak Gurantz, Shimon Tzukerman, Comstream Corporation, San Diego, CA 92121, Entitled "Digital T/2 Nyquist Filtering Using Recursive All–pass Two Stage Resampling Filters For A Wide Range Of Selectable Signalling Rates", Presented at Twenty Sixth Asilomar Conference on Signals, Systems & Computers, Pacific Grove, CA, Oct. 26–28, 1992 (2 pages).

Fred Harris, Entitled "Digital (T/2) Low pass Nyquist Filter Using Recursive Allpass Polyphase Resampling Filter for Signaling Rates 10 kHz to 10 MHz", 26th Annual Asilomar Conference on Signals, Systems, and Computers, Pacific Grove, CA., Oct. 26–28, 1992, Conference Record Twenty–Sixth Asilomar Conference on Signals, Systems & Computers, vol. 2 of 2, pp. 676–680, ISBN 0–8186–3160–0, IEEE catalog No. 92CH3245–8.

* cited by examiner

Primary Examiner—Chi Pham
Assistant Examiner—Emmanuel Bayard

(57) ABSTRACT

A low pass digital filter using cascade polyphase recursive digital signal processing circuit. The filter in the receive direction may contain a re-sampling Hogenauer filter followed by an equalizer filter to correct for its non-flat pass-band spectral response. The output of the spectral equalizer may be processed by a poly-phase re-sampling filter to reduce the sample rate. A clean-up filter may insert two stop-band spectral intervals in the frequency response of the earlier stages. The filter in the receive direction may be implemented by using similar components in the reverse order.

43 Claims, 22 Drawing Sheets

LOW PASS DIGITAL FILTER IMPLEMENTED IN A MODEM OF A TELEVISION SYSTEM

RELATED APPLICATION

The present invention is related to the co-pending Patent application entitled, "A Method and Apparatus for Enabling a User to Access Data Network Applications from a Television System", Filed Jun. 2, 1997, Ser. No. 08/867,203 (hereafter "RELATED APPLICATION 1"), and is incorporated in its entirety herewith.

BACKGROUND OF THE INVENTION

1. Field of the Invention

The present invention relates to digital signal processing (DSP), and more specifically to the implementation of a low-pass filter for filtering undesired high frequency components from a signal.

2. Related Art

Low pass filters are often used for eliminating high frequency spectral components from different types of signals. For example, as is well known in the relevant arts, low pass filters may be used in modems to eliminate (or substantially attenuate) spectral components having a frequency greater than 3.4 kHz in an analog signal. Such analog signals are generally generated at another modem (source modem) to encode digital data. A receiving modem may receive the analog signal and filter high frequency spectral components to recover the digital data as described below.

To recover the digital data from a received analog signal, a modem often needs to filter high frequency signal components (over 3.4 kHz bandwidth) typically present in a received analog signal. Ideally, only the frequency components having less than 3.4 kHz bandwidth should be passed, and the higher frequency components should be eliminated completely.

However, for many practical applications substantial attenuation (e.g., 60 dB) of the undesired components is sufficient. Typically, the transition from zero attenuation to 60 dB attenuation in 1 kHz presents complex challenges as is well known in the relevant arts.

Low pass filters are often implemented using digital signal processing (DSP) circuits as the circuits provide a cost-effective, compact (i.e., less space consuming), and flexible (i.e., designer can implement desired computational steps) way of eliminating the undesired frequency components. In a typical configuration using a DSP circuit, an analog to digital converter (ADC) may sample an analog signal to generate a high frequency data stream.

The ADC may be implemented using sigma-delta modulation, and generate a high frequency single bit output. A low pass filter implemented as a DSP circuit may process the digital samples to eliminate the high frequency components. The encoded digital data may be recovered from the digital samples representing the filtered signal.

A prior filtering system may be implemented using non-recursive polyphase filters (also known as finite impulse response filters). The output of a finite impulse response (FIR) filter always returns to zero when excited with a unit impulse. However, as is well known in the relevant arts, the FIR filter may need to perform a large number of computations to perform the filtering operation.

The large number of computations may be problematic in some situations as the filtering operation may need to be performed in "real time," that is, as the analog signal is being received. By filtering in real-time, large buffers may be avoided. The time required for computations may be decreased by employing complex hardware, but the required number of gates ("gate count") may be too numerous for integration on a single integrated circuit. In addition, circuits generally require more electrical power for performing a large number of computations, and accordingly such solutions may not be suitable at least in portable devices, which are often powered by electrical sources storing a limited amount of electrical power.

Therefore, what is needed is a circuit which optimizes one or more of the gate count, the number of computations, cost, and/or electrical power required while performing a filtering operation.

SUMMARY OF THE INVENTION

The present invention may be used to provide a low pass filter, particularly suited for use in a modem. The modem may contain a first low pass filter (interpolating transmit filter) used in the transmit direction, and a second low pass filter (decimating receive filter) used in the receive direction. Several features of the two filters are described below in further detail.

A decimating receive filter provided in accordance with the present invention filters high frequency components from an input signal represented by a digital data stream containing digital data elements. Each digital data element may contain a small number of bits. The low pass filter may contain a converter for receiving the digital data stream and for generating as output an integer in the interval K to −K, wherein K is an integer representing the range of the final output data stream.

A Hogenauer decimating filter decimates the output of the converter to generate a decimated output, wherein the decimated output exhibits a non-flat pass-band spectral response. An equalizer filter may process the decimated output to flatten the non-flat pass-band spectral response. A polyphase decimation filter may process the output of the equalizer filter, and a spectral cleanup filter processes the output of the decimation filter to modify the spectrum at band edges of the decimating filter.

The output of the spectral cleanup filter represents the filtered data. As the Hogenauer decimating filter is used in an early stage of the receive filter, the processing and hardware requirements may be minimized in the subsequent stages.

A low pass transmit filter may also be provided similarly. The low pass transmit filter may generate a high frequency digital data stream representing samples of a low pass signal from a lower frequency sampled digital data stream. Each of the two digital data streams contain a plurality of data elements, wherein each data element in the lower frequency data stream containing more number of bits than the data elements in the high frequency digital data stream. The high frequency digital data stream represents samples of a low pass signal suitable for transmission on a telephone line.

The transmit filter may contain a spectral cleanup filter for processing lower frequency digital data so that the spectrum of the lower frequency digital data meets a spectral mask (i.e., substantially attenuate components over the 3.4 kHz bandwidth) constraint at the band edges. A polyphase interpolating filter may be coupled to the output of the spectral clean up filter, and a pre-equalizer filter may be coupled to the output of the polyphase interpolating filter. A Hogenauer interpolating filter may be coupled to the pre-equalizer filter.

The Hogenauer interpolating filter increases the sample rate of the equalizer filter. The pre-equalizer pre-distorts the spectrum obtained from the polyphase interpolating filter to compensate for the spectral droop generated by the Hogenauer interpolating filter. The output of the Hogenauer interpolating stream may be a data stream composed of data words extending over a large number of bits. A converter receives the digital data stream and generating as output an integer +K or −K, where K is an integer representing the range of the input data stream.

The output of the transmit filter may be sent to a transmit modulator, which along with a DAC/filter and a data access arrangement transmits the data (encoded in analog signal) on a telephone line. Therefore, the present invention provides a modem suited for transmitting and receiving data on a telephone line.

The modem may be implemented while minimizing the number of gates as a Hogenauer decimating filter is used in the receive direction and a Hogenauer interpolating filter is used in the transmit direction.

The present invention allows a Hogenauer receive filter to be used in the receive direction as an equalizer filter may process the output of the Hogenauer decimation filter to flatten the non-flat pass-band spectral response.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein:

FIG. 6A is a graph illustrating in further detail the frequency response of equalizer of FIG. 5 around the desired pass-band;

DETAILED DESCRIPTION OF THE PREFERRED EMBODIMENTS

1. Overview and Discussion of the Invention

The present invention employs a cascade of multi-rate filter stages to change the bandwidth and sample rate of a signal sampled by an over-sampled (e.g., sigma-delta) converter. The first stage in the cascade may be implemented as a standard $N_1$-to-1 re-sampling Hogenauer (or cascade integrator-comb) filter. In an embodiment of the present invention, the re-sampling ratio ($N_1$) is selected to be 50 though any integer or rational ratio can be obtained by combinations of zero packing its input data stream and decimating the $N_1$ Hogenauer filter.

The Hogenauer filter may be followed by an equalizer filter to correct for its non-flat pass-band spectral response. The output of the spectral equalizer may be processed by an $N_2$-path poly-phase re-sampling filter implemented by multiple stages of recursive all-pass digital filters. This $N_2$-path filter reduces the sample rate by a factor of $N_2$. For the present invention, the re-sampling ratio ($N_2$) is selected to be 5 even though any integer or rational ratio can be obtained by combinations of zero packing its input data stream and decimating the $N_2$ path filter.

The final filter in the chain may be implemented as a two-path poly-phase non re-sampling filter containing multiple stages of zero-packed recursive all-pass digital filters. This final filter, referred to as the clean-up filter, inserts two stop-band spectral intervals in the frequency response of the earlier stages. These intervals include the band centered about zero frequency, and the band centered at the half-sample rate. The stop band centered at zero frequency may be required by the filter specification while the stop band centered at the half sample rate is required to suppress the bands aliased to the (output) half sample rate from the previous $N_2$-path decimating process.

As described below in further detail, the first stage filters spectral components above a pre-specified frequency, and the second stage operates to equalize the pass band spectral region of the final filtering and decimation process. The invention is best understood with reference to an example environment. Accordingly, an example environment for implementing the present invention is described below with reference to FIG. 1.

Several frequencies are used in the description below for illustration. However, the present invention can be used in other environments operating at different frequencies, and such other environments are contemplated to be within the scope and spirit of the present invention. Other environments include, for example, filtering and sample rate reductions for input signals sampled at different input rates and for signals with different output bandwidths and sample rates. The same process can be applied to different sample rate increases and for signals with different input bandwidths and sample rates.

2. Example Environment

Figure 1:
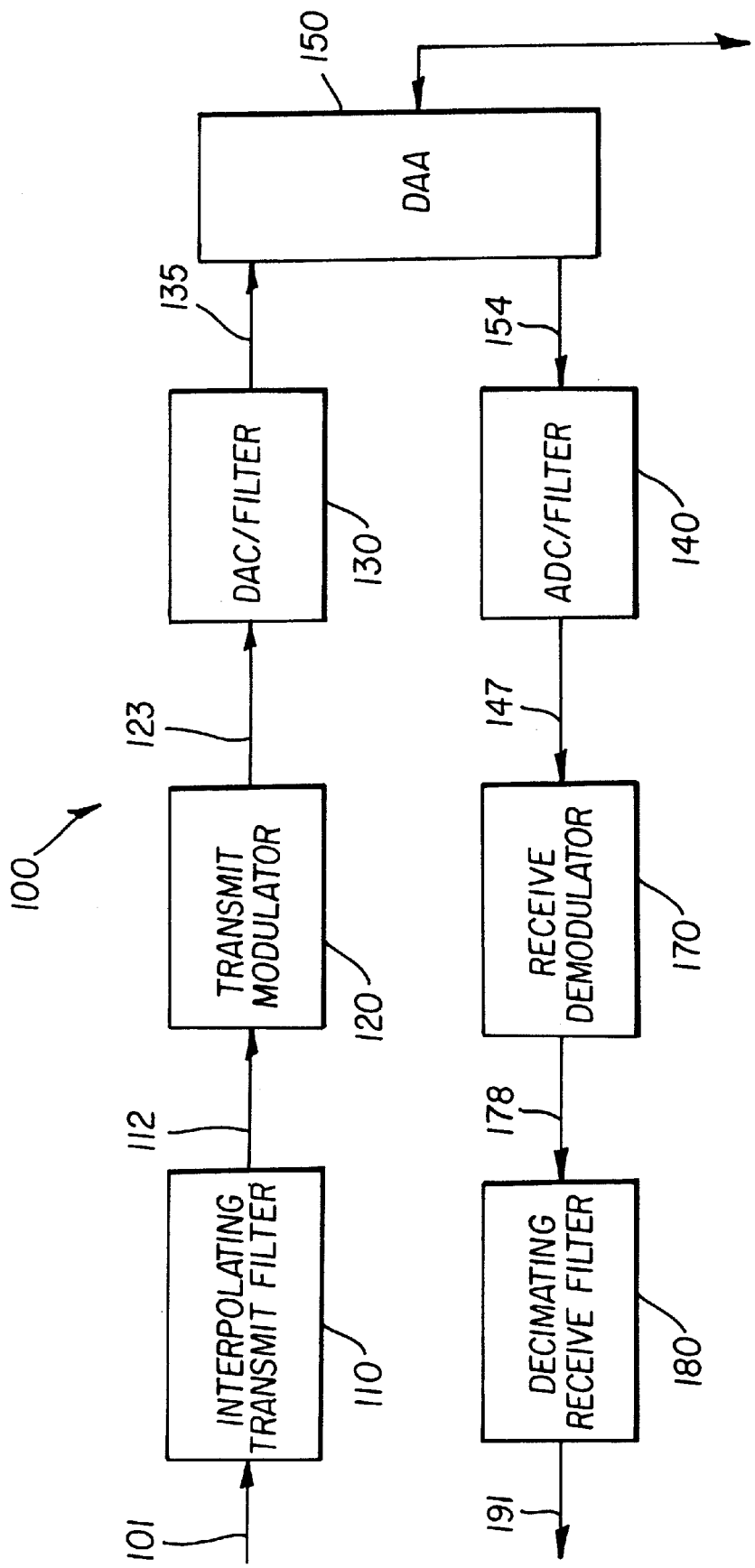
FIG. 1 is a block diagram of a modem illustrating an example environment for implementing the present invention.

FIG. 1 is a block diagram of an example modem 100 containing interpolating transmit filter 110, transmit modulator 120, digital-to-analog converter (DAC) /filter 130, data access arrangement (DAA) 150, analog low-pass or band-pass filter and analog-to-digital converter (ADC)/filter 140, receive demodulator 170, and decimating receive filter 180. As described in further detail below, modem 100 may receive multi-bit data on bus 101 and encode the received data in analog signals transmitted on phone line 151. Modem 100 may also receive analog signals on phone line 151, and decode any digital data encoded in the received signals, and send the digital data on bus 191.

DAA 150 generally includes an isolation transformer designed to prevent harmful (to any network connected via the telephone line 151) signals from being sent on telephone line 151. DAA 150 typical generates on telephone line 151 signals proportional in strength to the analog signals received on line 135. As related to data reception, DAA 150 generally generates on line 154 signals proportional to the strength of the signals received on phone line 151. DAA 150 may be implemented in a known way. Interpolating transmit filter 110 may receive multi-bit data on line 101, and generate a high frequency data stream on line 112 in accordance with the present invention. The high frequency stream may be generated using interpolation. An embodiment of transmit filter 110, which generates a 20-bit stream at 2 MHZ from 16 bit data received at 8 kHz, is described below in further detail.

Transmit modulator 120 may receive the 20-bit data stream at 2 MHZ on line 112 and generate a 1-bit output data at the same frequency on line 123. DAC/filter 130 operates as an analog low-pass or band-pass filter and converts the digital bit stream into analog signals, and performs low-pass or band-pass filter operation. The resulting analog signals are generally suitable for sending to DAA 150. Transmit modulator 120 and DAC 130 may be implemented using the sigma-delta conversion techniques well known in the relevant arts.

ADC/Filter 140 may receive analog signals from DAA 150 on line 154, and generate a high frequency 20-bit data stream on line 147. ADC/Filter 140 may be implemented in a known way. Receive demodulator 170 may generate a 1-bit data stream at the same frequency. ADC 140 and receive demodulator 170 may be integrated as one unit and be implemented according to delta-signal conversion techniques well known in the relevant arts.

Receive filter 180 receives the high frequency bit stream on line 178, and generates a multi-bit data at a lower frequency on line 191. The lower frequency data may be generated using decimation. An embodiment of receive filter 180, which generates 16 bit data at 8 kHz from 1-bit data stream received at 2 MHZ is described below in further detail.

The present invention enables decimating receive filter 180 and interpolating transmit filter 110 to be implemented while minimizing the circuit complexity (gate count). An embodiment of receive filter 180 is described first.

3. Receive Filter

Figure 2:
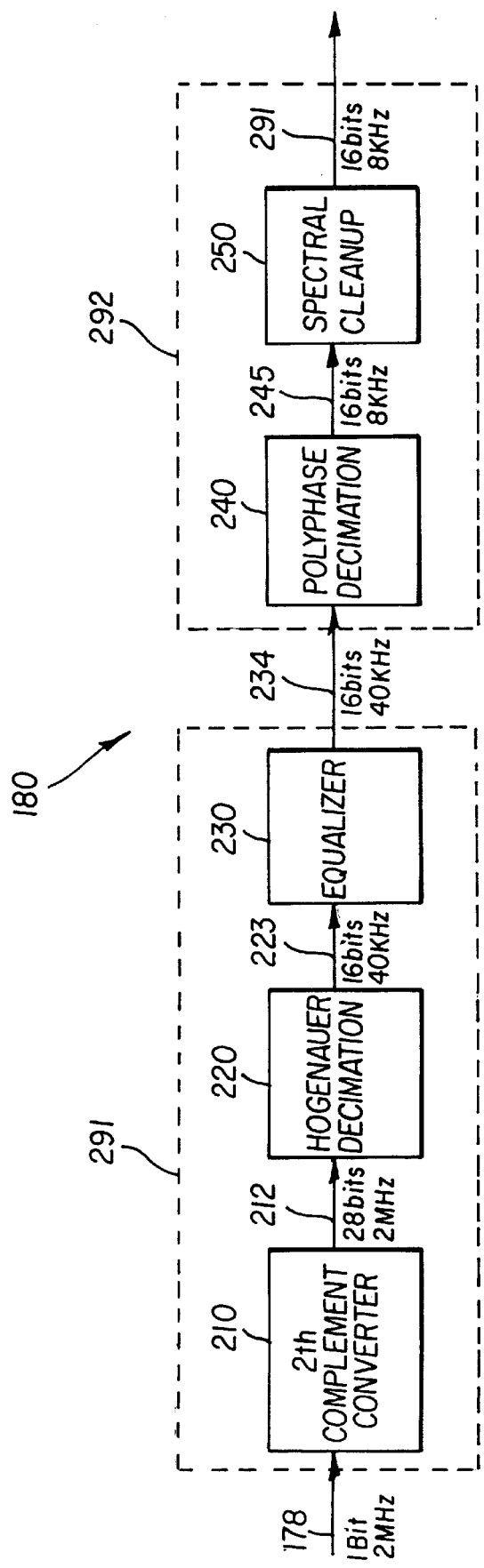
FIG. 2 is a block diagram of a transmit filter according to an embodiment of the present invention.

FIG. 2 is a block diagram illustrating the detailed implementation of receive filter 180 in one embodiment. Receive filter 180 may include 2's complement converter 210, Hogenauer decimation filter 220 and equalizer filter 230 in first stage 291. Receive filter 180 may also include polyphase 5-path decimation filter 240 and 2-path spectral cleanup filter 250 in second stage 292. Each component is described below in further detail.

Two's complement converter 210 may receive a one bit input at a frequency of 2 MHZ on line 147, and generate a 28 bit data stream at the same frequency. In an embodiment, an integer K is generated in response to receiving a 1, and a value of –K (minus K) in two's complement notation is generated in response to receiving 0. In general, K represents the gain control and may be received from a programmable register. The value of K determines the range of output of receive filter 180 on line 191.

Two's complement converter 210 is an example of a digital converter, which receives a low number of bits (one or two) in each digital data element, and converts the digital data element to a bigger number representing the gain. Also, the digital converters can operate with a greater number of bits (e.g., 2) in the input bit stream.

Even though 28 bits are used for K in this embodiment, a different number of bits can be used in receive filter 180. Typically, 25 bits may be sufficient, however the remaining three bits are used as a guard band as a precautionary measure. The implementation of two's complement converter 210 will be apparent to one skilled in the relevant arts.

Hogenauer decimation filter 220 is generally characterized by a transfer function of $[(1/m)\{(1-Z^{-m})/(1-Z^{-1})\}]^n$, wherein m is an integer representing the decimation factor and k is an integer representing the number of stages. In an embodiment described below, Hogenauer decimation filter 220 receives a 28 bit input at a frequency of 2 MHZ and decimates the input 50 times to generate a 16-bit output at a frequency of 40 kHz. In this embodiment, the Hogenauer filter is formed with 4-stages. An embodiment of Hogenauer decimation filter 220 is illustrated with reference to FIGS. 3, 4A and 4B below.

Hogenauer decimation filter 220 may be designed to attenuate frequencies above the desired pass-band of 0–3.4 kHz. However, the output generated on bus 223 may have undesirable attenuation (deviation from spectral flatness) in the pass-band.

Equalizer filter 230 may compensate for any undesirable attenuation in the pass-band (0–3.4 kHz) of the output of Hogenauer decimation filter 220. An embodiment of equalizer filter 230 is described below in detail with reference to FIGS. 5, 6A and 6B.

Polyphase decimation filter 240 may generate multi-bit digital data at a lower frequency by decimating the output signal of equalizer filter 230. An embodiment of polyphase filter 240 which decimates five times (40 kHz to 8 kHz) is described below with reference to FIGS. 7–10.

Spectral cleanup filter 250 may be implemented as a multi-band stop-band filter. The multi-band stop band filter operates to attenuate the multiple transition band widths which result from the decimation operation of the polyphase decimation filter 240. An embodiment of spectral cleanup filter 250 is described below in with reference to FIGS. 11–16.

As illustrated below in further detail, the present invention enables receive filter 180 to be implemented while minimizing the number of required gates.

4. Two's Complement Converter and Hogenauer Decimation Filter

Figure 3:
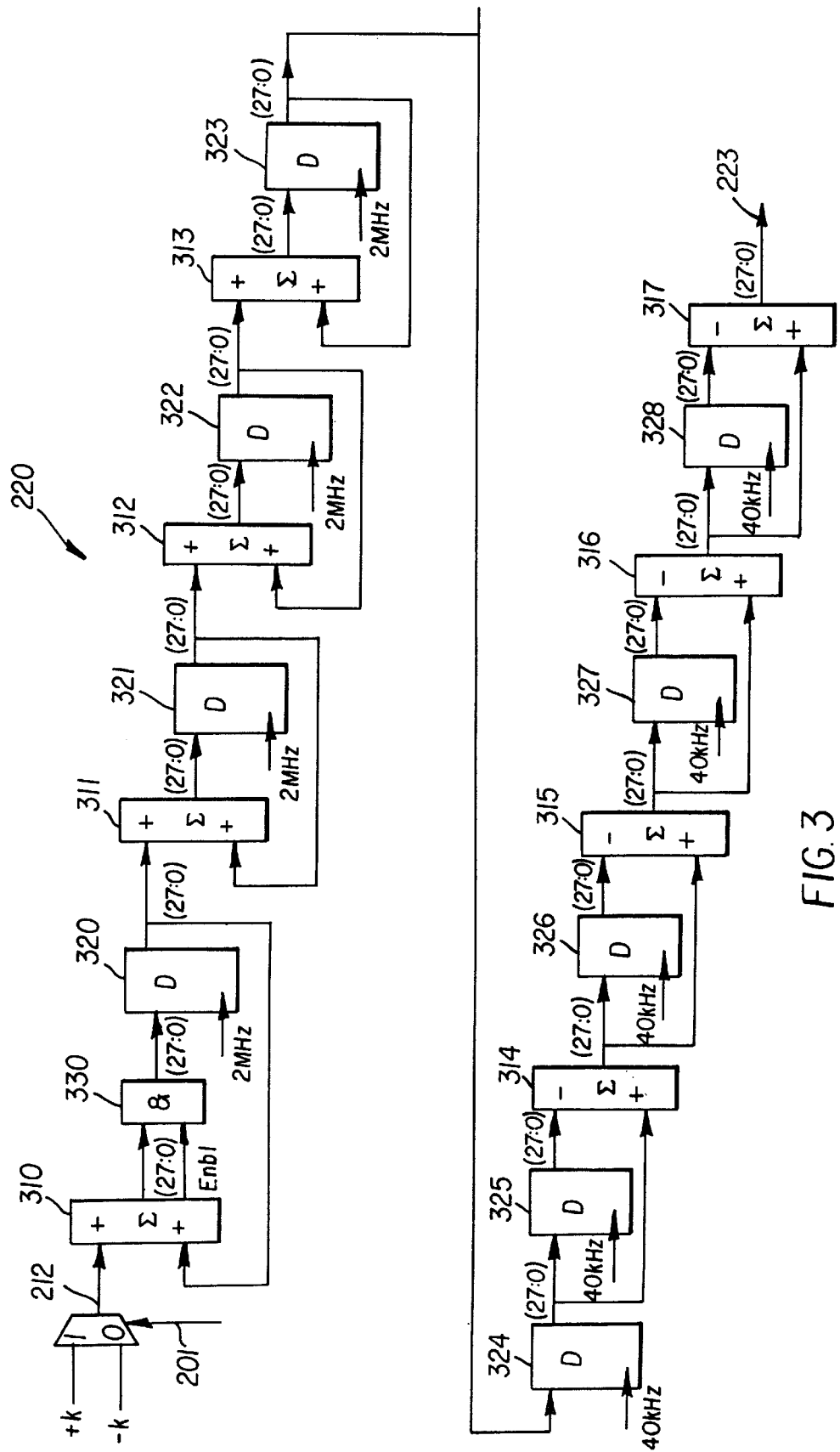
FIG. 3 is a block diagram illustrating the implementation of a Hogenauer filter used in a filter provided in accordance with the present invention.

FIG. 3 is a block diagram illustrating two's complement converter 210 along with Hogenauer decimation filter 220 in one embodiment. Two's complement converter 210 may include multiplexor 301, having 28 bit values K and –K (in two's complement form) as inputs, wherein K is an integer. K may be referred to as the gain control. Multiplexor 301 generates either K or –K as output depending on whether 0 or 1 is received on control line 178.

Hogenauer decimation filter 220 of FIG. 3 is designed to implement a transfer function of $[\frac{1}{50}\{(1-Z^{-50})/(1-Z^{-1})\}]^4$. Hogenauer decimation filter 220 may include adders 310–313, subtractors 314–317 and delay elements 320–328. Notably, adders 310–313 and delay elements 320–323 operate at higher frequency (2 MHZ) and subtractors 314–317 and delay elements 324–328 operate at lower frequencies (40 kHz). The output of Hogenauer decimation filter 220 is generated at the lower frequency enabling subsequent components of receive filter 180 to operate at a lower frequency.

Adder 310 adds the 28-bit input received from two's complement converter 210 and the output of delay element 320, and provides the output to AND logic 330. AND logic 330 passes the received data to delay element 320 only when the ENABLE signal is high (i.e., equal to 1). The combination of AND logic 330 and ENABLE signal is used to reset delay element 330 during initialization. The output of AND logic 330 is stored in delay element 320.

Adder 311 adds the data stored in delay elements 320 and 321, and stores the result in delay element 321. Adder 312 adds the data stored in delay elements 321 and 322, and stores the resulting output in delay element 322. Adder 313 adds the data stored in delay elements 322 and 323, and stores the output in delay element 323.

Delay element 324 receives data from delay element 323. However, delay element 324 may be clocked at a lower frequency (40 kHz) to decimate the signal represented by the output data of delay element 323. The remaining components in the data flow of Hogenauer decimation filter 220 may operate at the lower frequency. Delay element 325 stores the data received from delay element 324.

Subtractor 314 subtracts the data stored in delay element 325 from the data stored in delay element 324, and stores the result in delay element 326. Subtractor 315 subtracts the data stored in delay element 326 from the output of subtractor 314, and stores the result in delay element 327. Subtractor 316 subtracts the data stored in delay element 327 from the output of subtractor 315, and stores the result in delay element 328. Subtractor 317 subtracts the data stored in delay element 328 from the output of subtractor 316, and provides the output to equalizer 230.

Figure 4A:
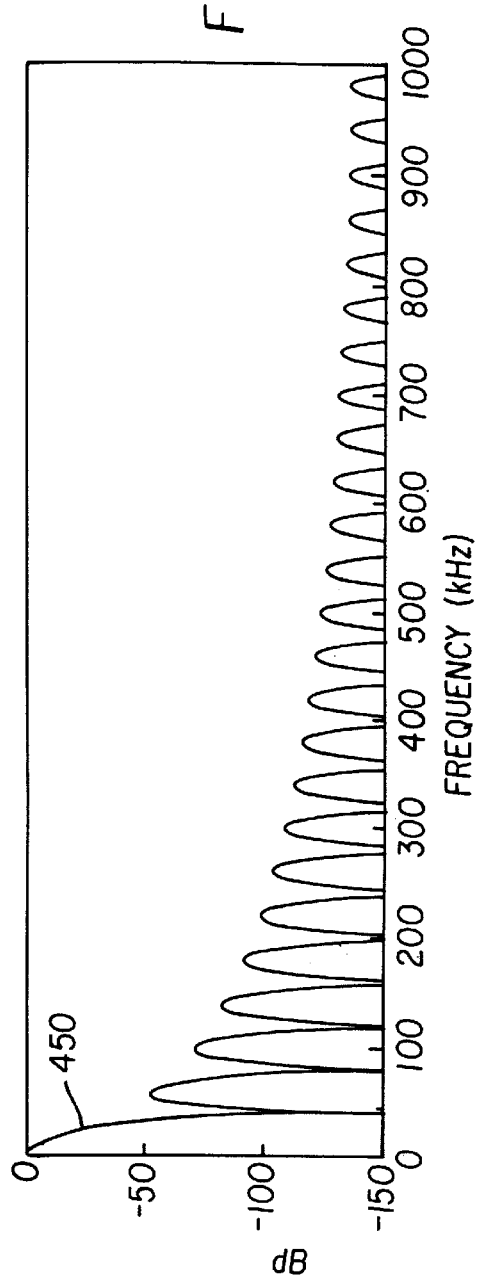
FIG. 4A is a graph illustrating the spectral response of a Hogenauer filter.
Figure 4B:
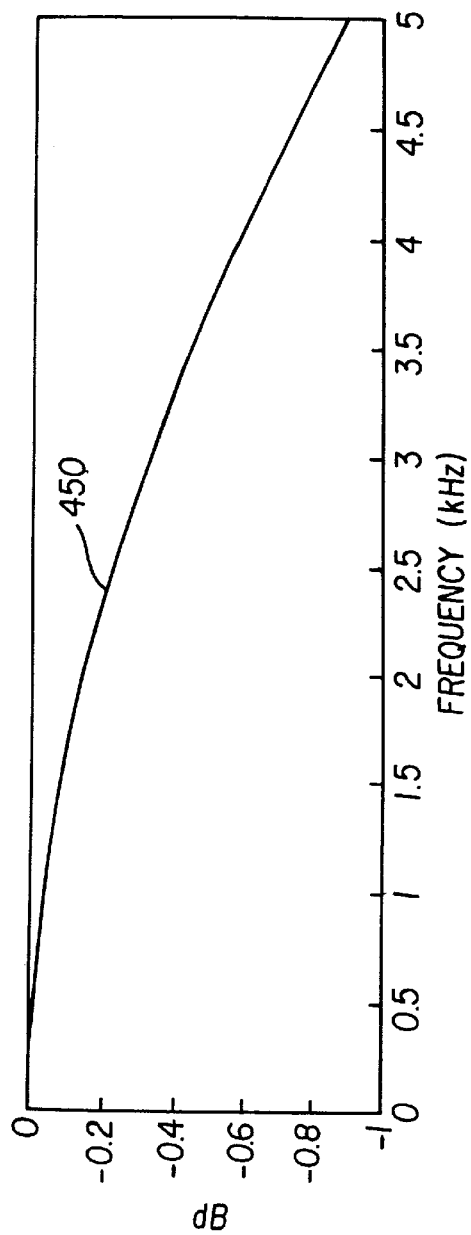
FIG. 4B is a graph illustrating in further detail the spectral response of Hogenauer filter around the desired pass-band.

The frequency response 450 characterizing the output of subtractor 317 (Hogenauer decimation filter 220) is depicted in FIGS. 4A and 4B. In all the Figures related to frequency response, frequency is represented on X-axis, and the attenuation in decibels is represented on Y-axis. Frequencies below approximately 50 kHz is attenuated more than 50 dB, and the attenuation is progressively more for higher frequencies. Frequencies which alias back into the desired 0–3.4 kHz band are attenuated by more than 100 dB by the multiple zeros of the Hogenauer filter.

FIG. 4B depicts in farther detail the attenuation around the desired passband. Less than or equal to 0.4 dB attenuation is present for frequencies less than 3.4 kHz. The ideal frequency response should approximate zero attenuation to an acceptable tolerance in the desired passband. The deviation (non-flat portion) of line 450 from the 0 db line is thus undesirable. The components in the subsequent data path operate to correct the deviation to the acceptable tolerance as described below in further detail.

As should be appreciated, by decimating the input signal by a factor of 50, Hogenauer decimation filter 220 enables subsequent components in the connection path to operate at a lower frequency. As a result, the gate count may be reduced as illustrated with specific embodiments below.

5. Equalizer

Figure 5:
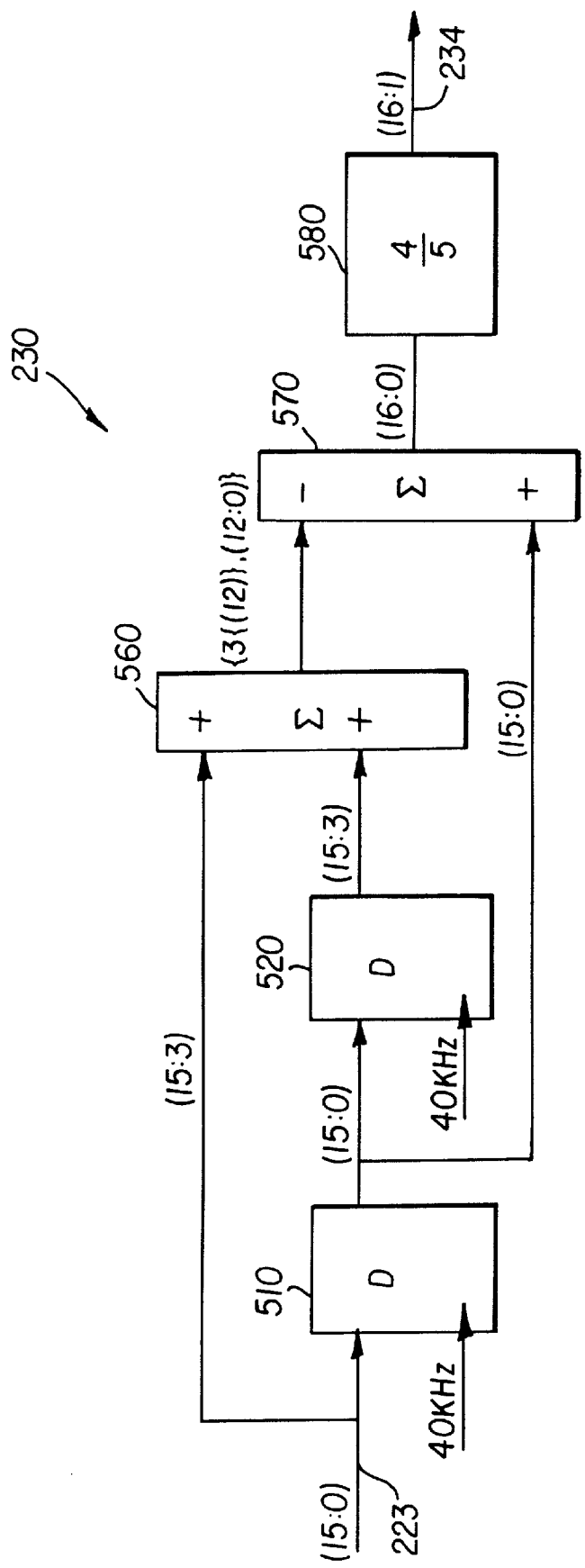
FIG. 5 is a block diagram illustrating the implementation of an equalizer filter in an embodiment of the present invention.

FIG. 5 is a block diagram illustrating an embodiment of equalizer 230. Equalizer 230 may be implemented as a three tap FIR filter providing a transfer function $H(z)=-\frac{1}{8}+Z^{-1}-\frac{1}{8}Z^{-2}$. The FIR filter coefficients $\{-\frac{1}{8}, 1, -\frac{1}{8}\}$ were selected for ease of implementation in this embodiment. Other coefficients which may or may not require multipliers may be substituted for the listed coefficients to achieve a smaller tolerance approximation to the desired pass band gain of 0-dB. Equalizer 230 may include delay elements 510 and 520, adders 560 and 570, and gain correction 580.

Delay element 510 may store the decimated data received on bus 223. Delay element 510 may store the data output by delay element 520. Adder 560 adds the decimated data received on bus 223 and the data stored in delay element 520. Adder 570 adds the output data generated by adder 560 and the data stored in delay element 510, and provides the output to multiplier 580. Multiplier 580 may multiply the filtered data by $\frac{4}{5}$ and provide the resulting output on bus 234. In an embodiment, the multiplication may be implemented as $1-\frac{1}{4}+\frac{1}{16}-\frac{1}{128}$.

Figure 6A:
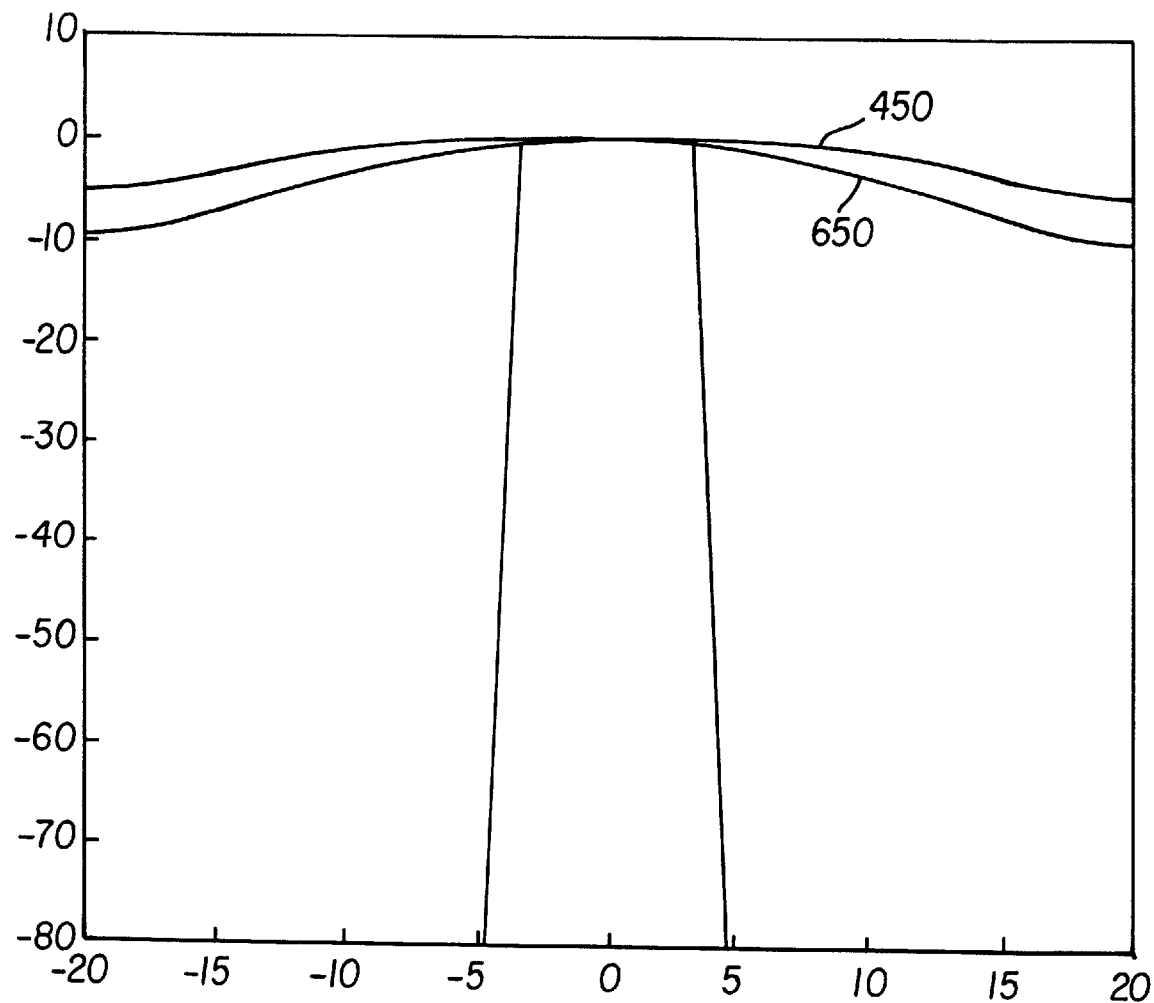
FIG. 6A is a graph illustrating the frequency response of the equalizer of FIG. 5.
Figure 6B:
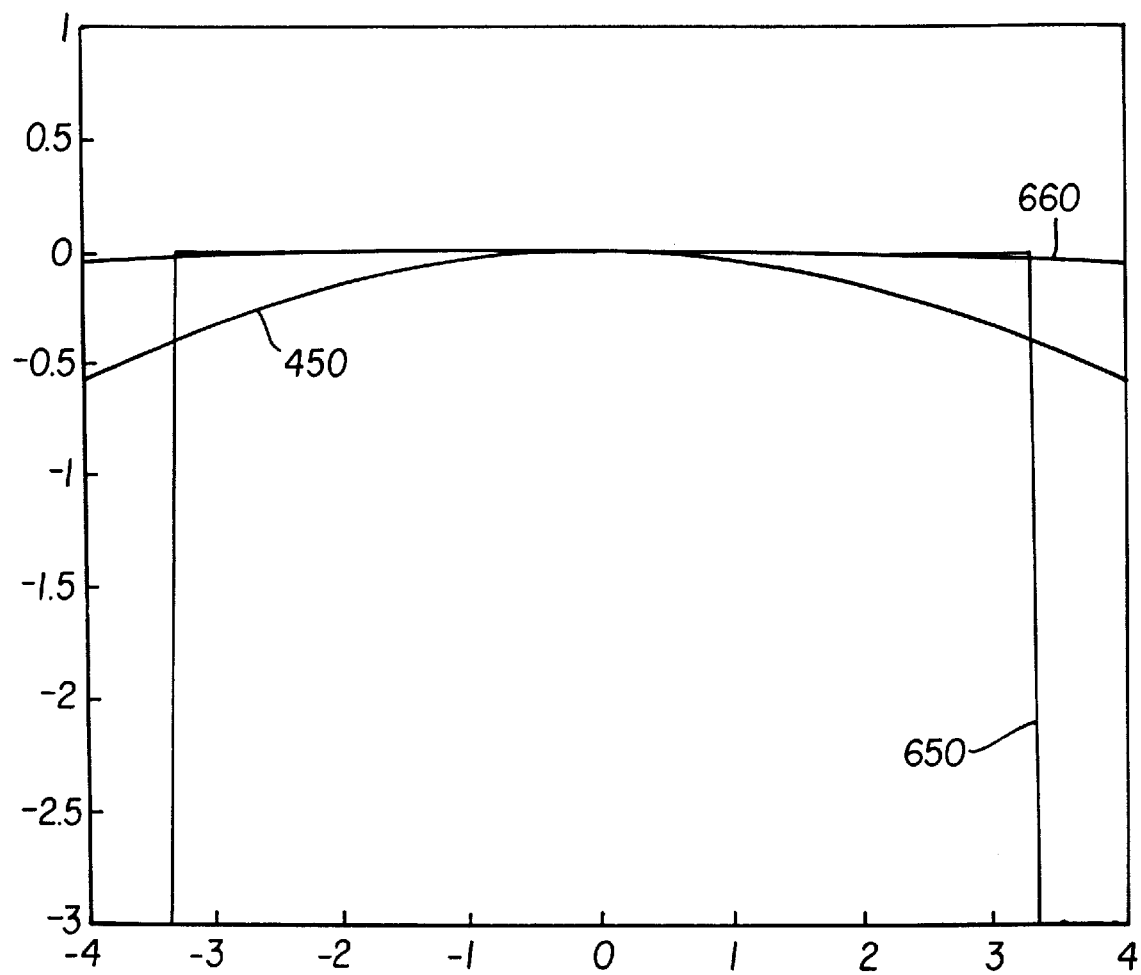

FIGS. 6A and 6B illustrate the frequency response of equalizer 230. The response of Hogenauer decimation filter 220 is shown as line 450, while the response of equalizer is shown as line 650 for comparison. As may be readily appreciated, the filtering corrects the undesirable attenuation created in the pass-band by Hogenauer decimation filter 220. Specifically, as apparent from FIG. 6B, the frequency response 650 is closer to the flat line 660 (i.e., no attenuation) than the frequency response 450 in the pass-band (0–3.4 kHz). The manner in which the subsequent components in the data path of receive filter 180 may process the output of the first stage is described below with additional examples.

6. N-Path Recursive Polyphase Decimation Filter

Figure 7:
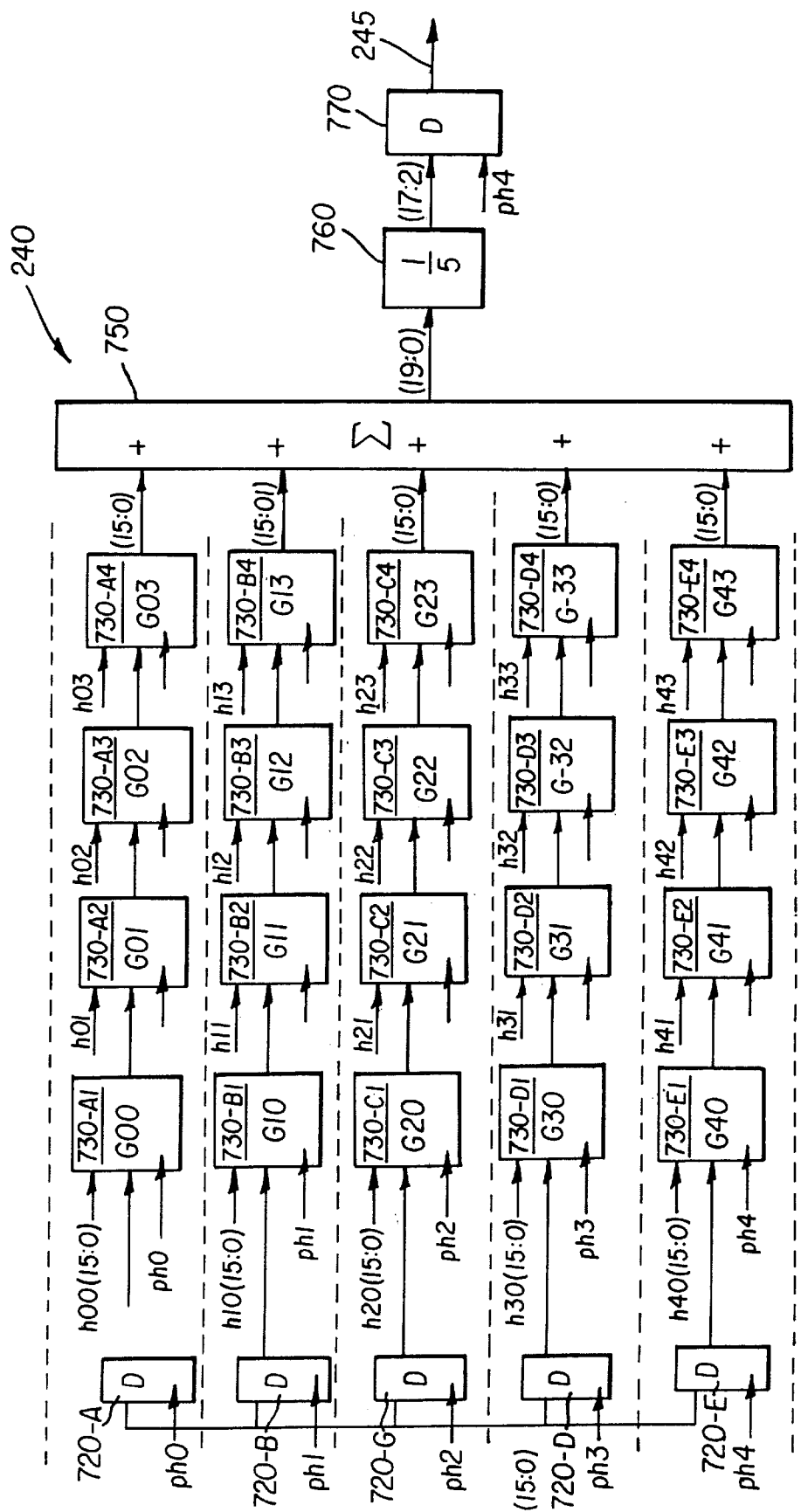
FIG. 7 is a block diagram illustrating the implementation of polyphase decimation filter in one embodiment.

FIG. 7 is a block diagram illustrating an embodiment of N-path polyphase decimation filter 240, which decimates the input signal five times, that is, from 40 kHz to 8 kHz. Even though the embodiment is implemented as a non-recursive polyphase filter, it should be understood that recursive techniques can be implemented as well in alternative embodiments without departing from the scope and spirit of the present invention.

Figure 8:
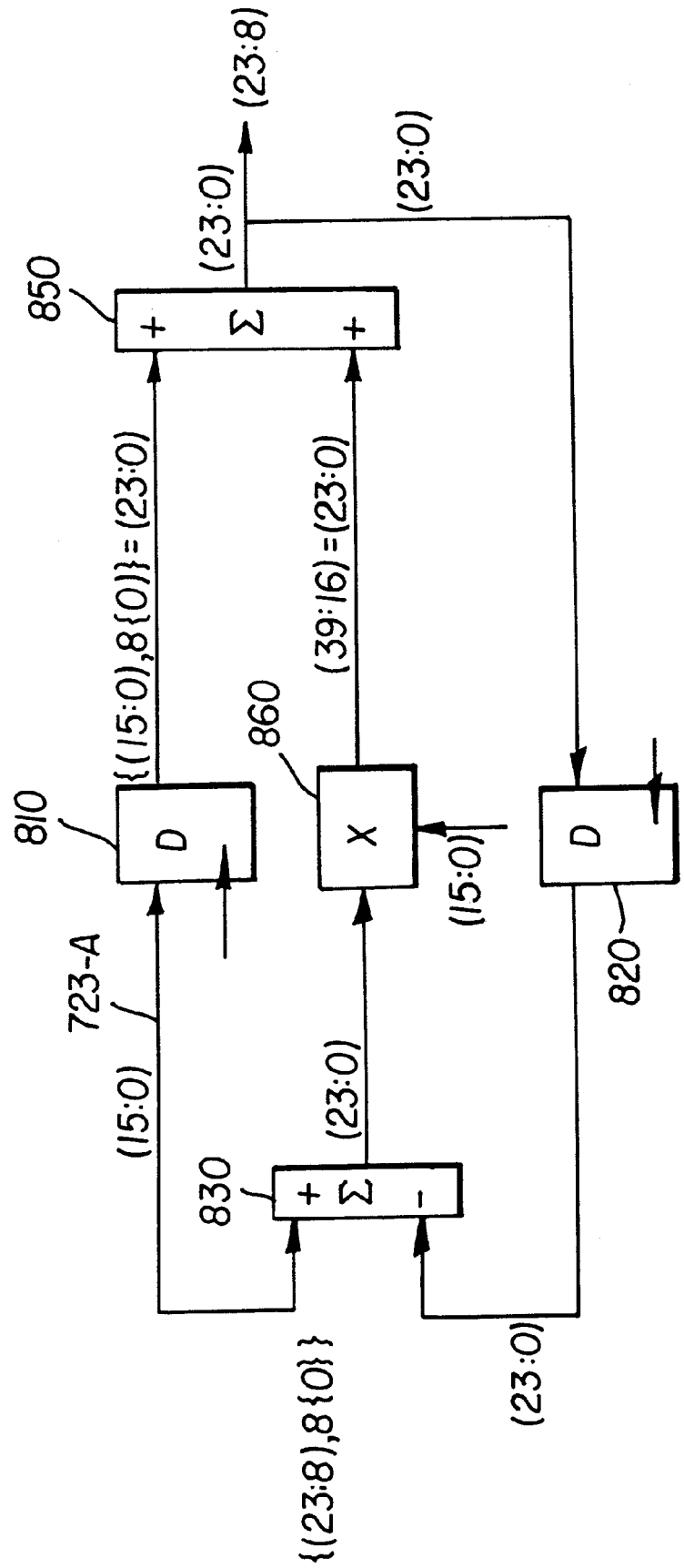
FIG. 8 is a block diagram illustrating the implementation of a G-cell used in the polyphase decimation filter of FIG. 7.

Polyphase decimation filter 240 may contain five all-pass processors defined as its separate phase characteristic. Each all-pass phase processor contains a delay element and four G-cells connected in sequence. The G-cells may be implemented as all-pass recursive sub-processors as shown in FIG. 8. For example, the first phase processor is shown containing delay element 720-A and G-cells 730-A1 through 730-A4. Each phase processor processes a different one of five successive data values received on bus 234 from equalizer 230. The timing signals driving the five phase processors are first illustrated with reference to FIG. 9.

Figure 9:
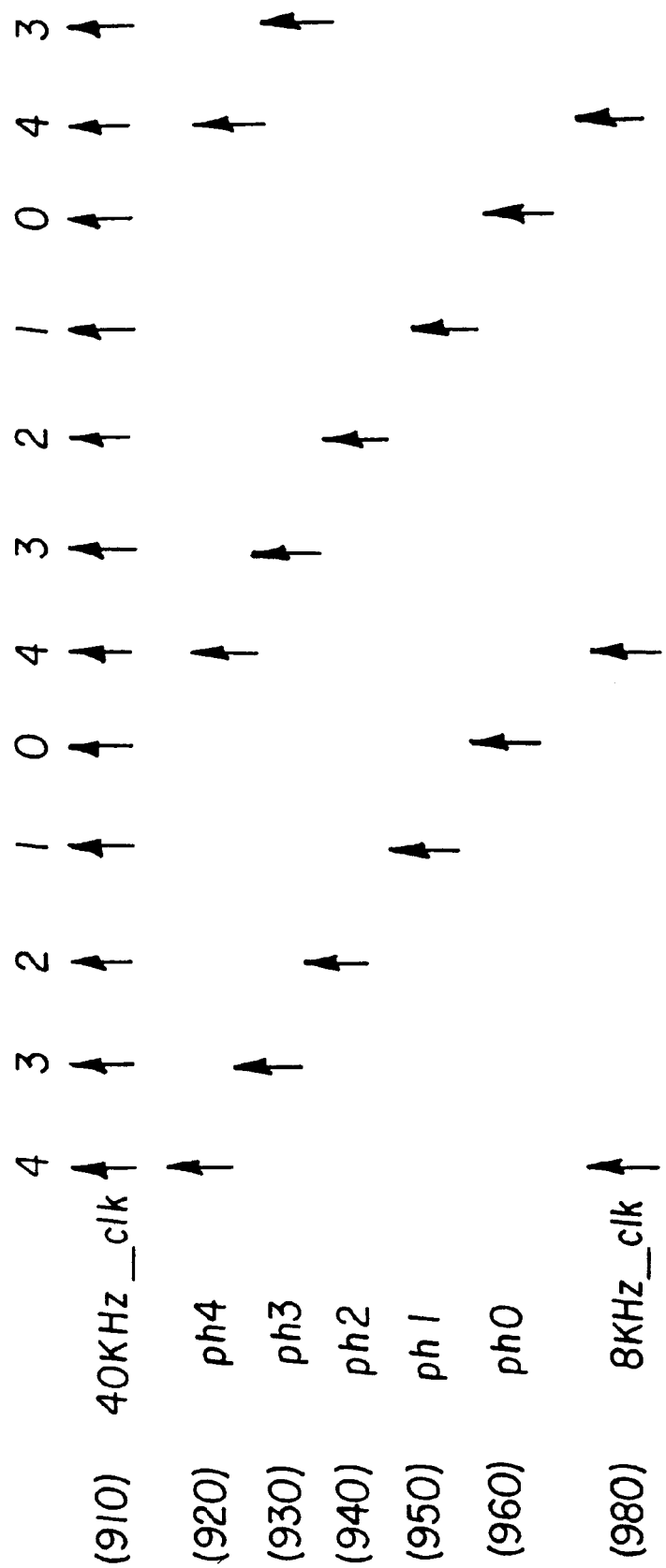
FIG. 9 is a timing diagram illustrating the phases of a clock used by different phase processors of polyphase decimation filter of FIG. 7.

With reference to FIG. 9, the 40 kHz clock signal is shown in line 910. The clock signals ph0 through ph4 which provide input to phase processors 710-A through 710-E are shown on lines 920, 930, 940, 950 and 960 respectively. The input data received on line 234 at 40 kHz is provided as input to the phase according to the respective clock signal. A 8 MHZ clock is shown in line 980.

Continuing with reference to FIG. 7 again, for conciseness the operation and implementation of only the first phase processor is described. However, the description may be applicable to other four phase processors as well. Phase processor 710-A may contain delay element 720-A and cells 730-A1 through 730-A4. Each cell may be designed to implement a transfer function $G(z)=\{(1-az)/(z-a)\}$, wherein 'a' is a coefficient equal to one of the h parameters (e.g., h01, h02, etc.). The coefficients $h_{kj}$ are computed by a design routine which computes filter coefficients for the recursive polyphase structures.

An embodiment of cell 730-A1 is illustrated with reference to FIG. 8. Cell 730-A1 may contain delay elements 810 (with 16 bits) and 820 (24 bits), adders 830 (24 bits) and 850 (21 bits), and multiplier 860 (24×16 bits). Delay element 810 stores 16-bit data received on bus 723-A. Delay element 820 stores the 24-bit output of adder 850.

Adder 880 adds the data received on bus 723-A and delay element 820, and provides the output to multiplier 860. The least significant eight bits of the 23 bit input from bus 723-A may be padded with zeroes to provide the 24-bit input to adder 830. Multiplier 860 multiplies the 24 bit output of adder 830 with the coefficient 'a' (i.e., one of the h values) to generate 40 bit output. Adder 850 adds the least significant 24 bits of the output generated by multiplier 860 and 24 bits logically constructed by padding the 16 bits stored in delay element 810 with zeros in the least significant eight bits. Only the most significant 16 bits of the output of adder 850 are provided as input to the subsequent cell Continuing with reference to FIG. 7 again, the chain of four cells 730-A1 through 730-A2 processes every fifth data element received on bus 234. The 16 bit outputs of phase processors 710-A through 710-E are provided as inputs to adder 750. Adder 750 generates a 20-bit output. Gain compensator 760 may multiply each output by approximately ⅕. In an embodiment, gain compensator 760 is implemented as (¼−1/16+1/64−1/512). The most significant 16 bits may be provided as an input to delay element 770. Delay element 770 may be clocked at 8 kHz (shown in FIG. 9) to decimate the signal.

Figure 10:
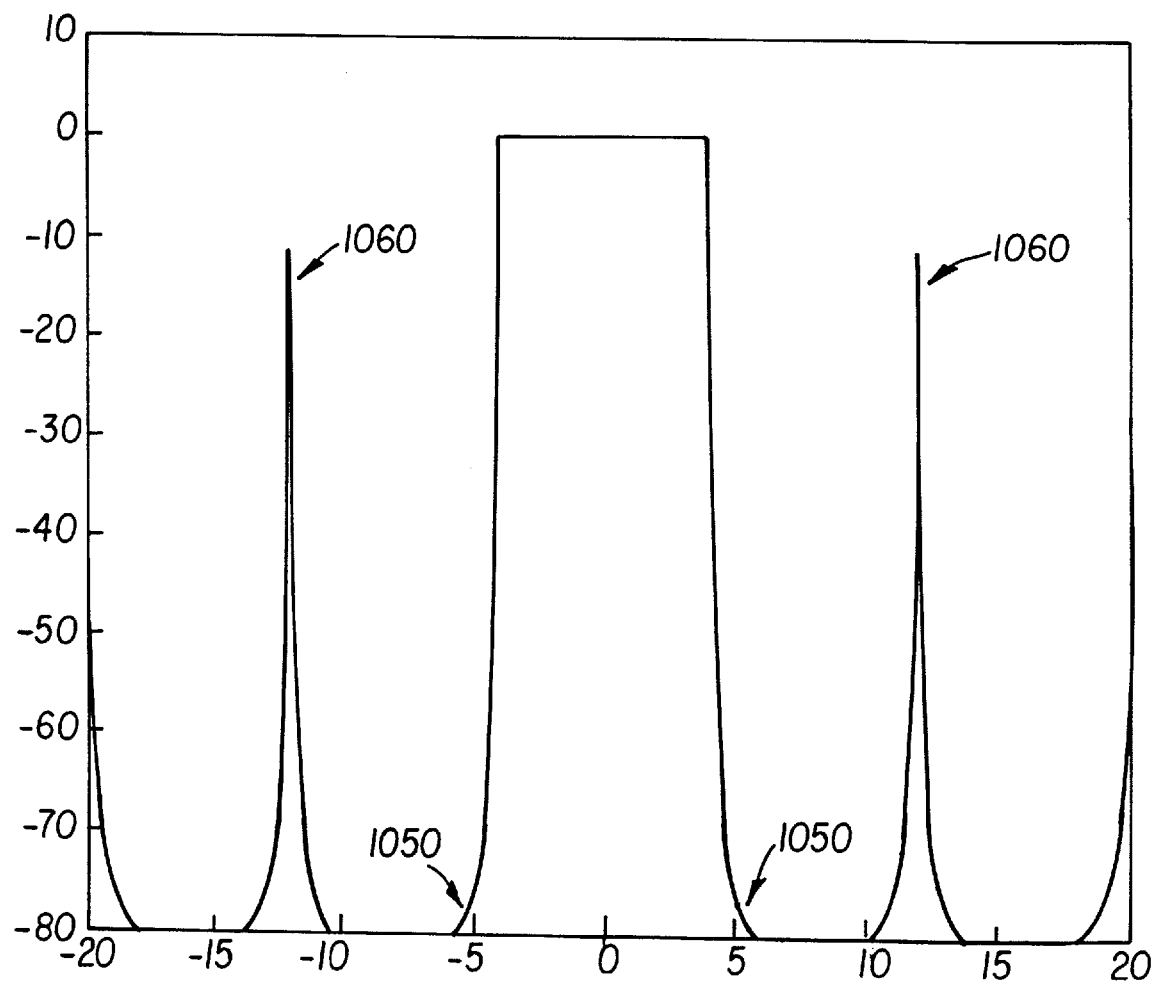
FIG. 10 is a graph illustrating the frequency response of polyphase decimation filter of FIG. 7.

FIG. 10 illustrates the frequency response of the non-decimated polyphase decimation filter 240. The signal is not attenuated in the pass band, while insufficient attenuation may be present at the edge of the passband, e.g., shown at points 1050. In addition, multiple spectral transition bands, characteristic of N-path polyphase recursive filters, indicated by 1060 are undesirable. Spectral clean-up filter 250 may be used to correct these undesired attributes as illustrated below.

7. Spectral Clean-up Filter

Figure 11:
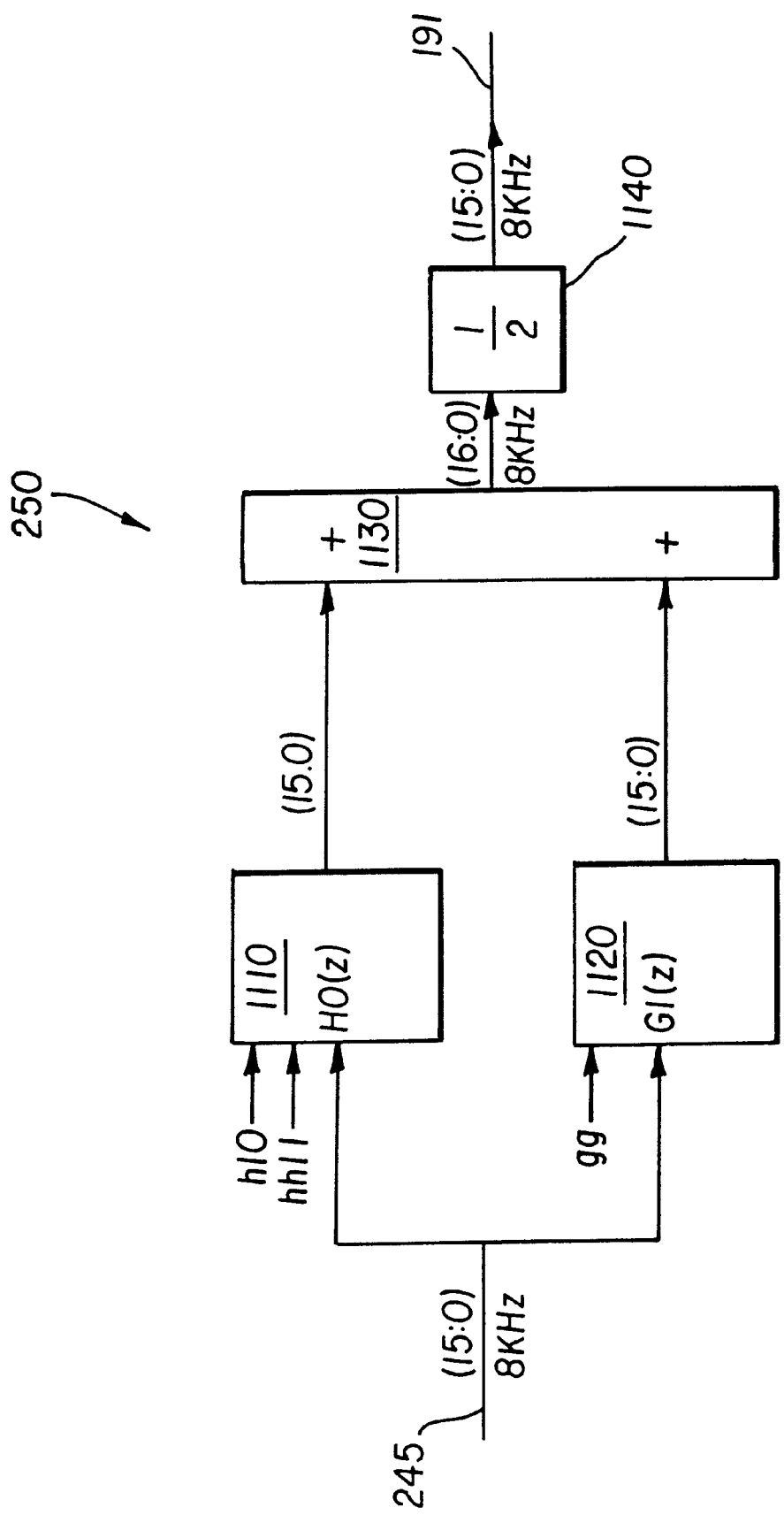
FIG. 11 is a block diagram illustrating the implementation details of an embodiment of spectral cleanup filter.

FIG. 11 is a block diagram illustrating an embodiment of spectral clean-up filter 250, which may receive data at 8 kHz and send processed data at the same rate. Spectral clean-up filter 250 may contain H-cell 1110, G1-cell 1120, adder 1130 and gain compensator 1140. Each component is described below in further detail.

Figure 12:
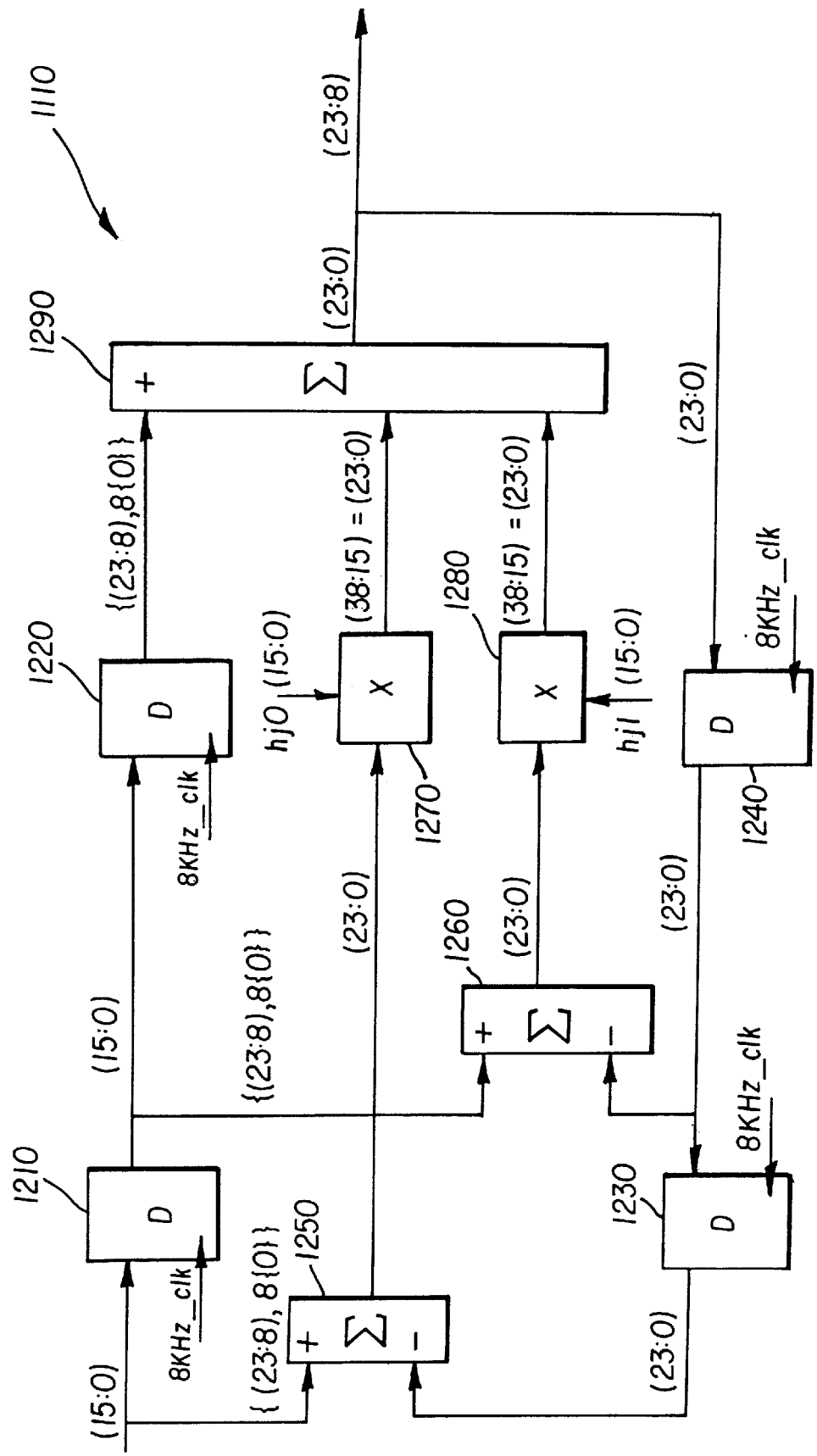
FIG. 12 is a block diagram illustrating the implementation details of an embodiment of H-cell used in the spectral cleanup filter of FIG. 11.

FIG. 12 is a block diagram illustrating an embodiment of H-cell 1110 implemented as a two path low pass filter. The filter implements a transfer function $H(z)=\{(1+h_0Z+h_1Z^2)/(Z^2+h_0Z+_1)\}$. H-cell 1110 may contain two 16-bit delay elements 1210 and 1220, another two 24-bit delay elements 1230 and 1240, two 24-bit adders 1250, 1260 and 1290, and multipliers 1270 and 1280.

Delay element 1210 stores the 16-bit data received from polyphase decimation filter 240. The output of delay element 1210 is connected to the input of delay element 1220. Delay element 1240 stores the output of adder 1290. The output of delay element 1240 is connected to the input of delay element 1240.

Adder 1250 adds the data received from polyphase decimation filter 240 and the data stored in delay element 1230. The 16 bits received from polyphase decimation filter 240 may be padded with zeros in the eight least bit significant bit (LSB) positions to generate the 24-bit input for adder 1250. Adder 1260 adds the data (8 LSB padded with zero) stored in delay element 120 and the output of delay element 1240, and provides the output to multiplier 1280.

Multiplier 1270 multiplies the output of adder 1250 with $h_{j0}$ (16 bits), and multiplier 1280 multiplies the output of adder 1260 with $h_{j1}$. Both adders may generate 40 bit output data, and only the most significant 24 bits may be provided to adder 1290. Adder 1290 adds the two inputs to generate the cell output for adder 1130 of FIG. 11.

G1-cell 1120 may be implemented substantially similar to the G-cell described with reference to FIG. 8. Only the differences will be noted here for conciseness. The input to delay element 810 is provided from bus 245 (not 723-A as shown in FIG. 8). In addition, adder 850 may add 16 bits at positions 38 through 15 (instead of 39 through 16).

Continuing with reference to FIG. 11, adder 1130 adds the data received from G1-cell 1120. Gain compensator 1130 divides the output data by two. The output represents the output of receive filter 190 provided on bus 191.

Figure 13:
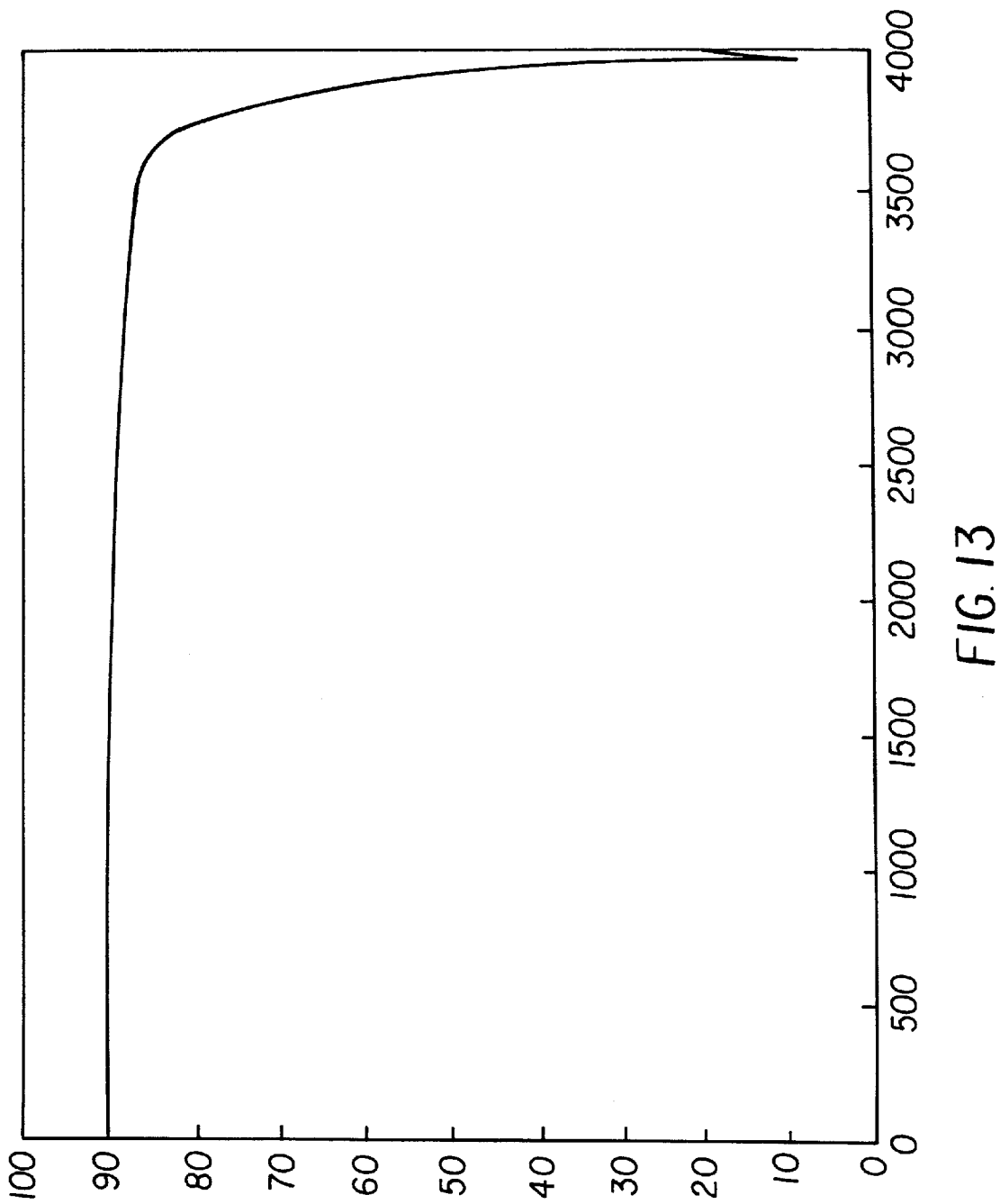
FIG. 13 is a graph illustrating the frequency response of the spectral cleanup filter of FIG. 11.

FIG. 13 illustrates the frequency response of spectral cleanup filter. As may be readily apparent by comparison with FIG. 10B, the edges at the pass band are smooth and very limited attenuation is present in the pass band. Thus, the output of receive filter 180 may contain digital data representing filtered analog signal received on line 154.

However, one problem with the output of spectral cleanup filter 250 is that the frequency components in the range of 0–0.3 kHz are also passed, and typical telephone voice channels do not use that frequency range. It may accordingly be desirable to filter the components in the 0–0.3 kHz range. In an embodiment such filtering may be handled in software after the data is received on bus 191. However, an alternative embodiment may eliminate 0–0.3 kHz components as described below with reference to FIGS. 14–16.

8. Alternative Embodiment of Spectral Clean-up Filter

Figure 14:
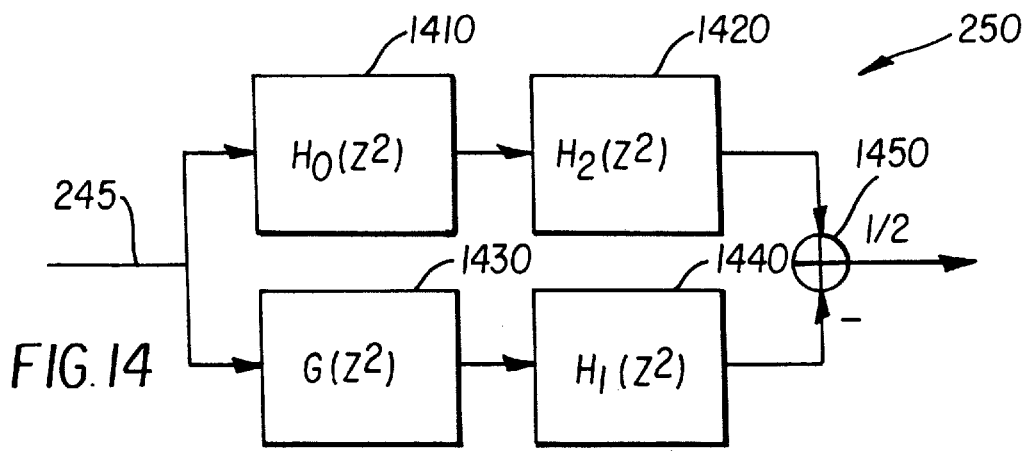
FIG. 14 is a block diagram illustrating the implementation details of an alternative embodiment of spectral cleanup filter.

FIG. 14 is a block diagram illustrating an alternative embodiment of spectral cleanup filter 250 implemented as $7^{th}$ order polyphase filter with two paths. One path is shown with two $2^{nd}$ order all-pass filters H ($Z^2$) cell 1410 and H ($Z^2$) cell 1420, and the other path is shown with a first order all pass filter G ($Z^2$) cell 1430 and H cell ($Z^2$) 1440. Adder 1450 may add the outputs of the two paths and then perform a required scaling operation by dividing sum by the factor 2. The H ($Z^2$) cells 1410, 1420 and 1440 may each operate with a different set of coefficients. Spectral cleanup filter 250 implements a transfer function=$\{(1+a_1Z^2+a_2Z^4)/(Z^4+a_1Z^2+a_2)\}$. The implementation of the cells is described below.

Figure 15:
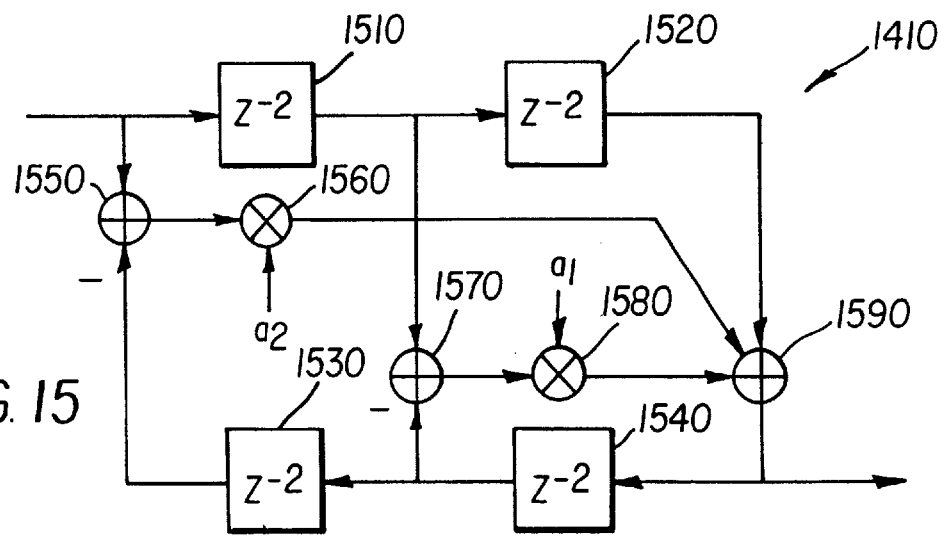
FIG. 15 is a block diagram illustrating the implementation details of a $H(Z^2)$ cell used in spectral cleanup filter.

FIG. 15 is a block diagram illustrating an embodiment of H ($Z^2$) cell 1410. The description is applicable to other H ($Z^2$) cells 1420 and 1440 as well. $Z^{-2}$ sub-cell 1510 processes the data received and provides the output to both $Z^{-2}$ sub-cell 1520 and adder 1570. $Z^{-2}$ sub-cell 1520 processes the received data and sends the output data to adder 1590. $Z^{-2}$ sub-cell 1540 processes data received from adder 1540 and sends the output to $Z^{-2}$ sub-cell 1530 and adder 1570. $Z^{-2}$ sub-cell 1530 processes the received data and provides the output data to adder 1550. Each $Z^{-2}$ sub-cell converts the high pass filter of the first embodiment of the clean-up filter to a combined low-pass and high pass filter. This process will be apparent to one skilled in the relevant arts.

Adder 1550 adds the data received by H ($Z^2$) cell 1410 and the output of $Z^{-2}$ sub-cell 1530, and provides the output to multiplier 1560. Adder 1570 adds the output of $Z^{-2}$ sub-cells 1510 and 1530, and provides the output to multiplier 1580. Adder 1590 adds the output of multipliers (1560 and 1580) and $Z^{-2}$ sub-cell 1520, and provides the output to $Z^{-2}$ sub-cell 1540 and as the output of H ($Z^2$) cell 1410.

Multiplier 1560 multiplies the data received from adder 1550 with $a_1$ and provides the output to adder 1590. Multiplier 1580 multiplies the output of adder 1570 with coefficient $a_2$ and provides the output to adder 1590.

Figure 16:
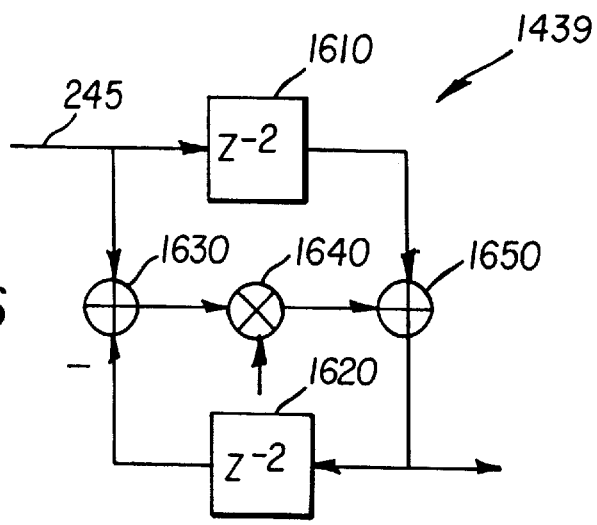
FIG. 16 is a block diagram illustrating the implementation details $G(Z^2)$ cell used in spectral cleanup filter.

FIG. 16 is a block diagram illustrating an embodiment of G ($z^2$) cell 1430 in an embodiment. G ($z^2$) cell 1430 is designed to implement a transfer function=$\{(1+a_1z^2)/(z^2+a_1)\}$. $Z^2$cell 1610 receives the input data from bus 245 delays the output by 2 clock cycles. Adder 1630 adds the input data received on bus 245 and the output of $Z^{-2}$cell 1620. Multiplier 1640 multiplies the output of adder 1630 with coefficient $a_3$. As indicated earlier, coefficients for the filter may be computed by an algorithm specifically designed to compute coefficients of N-path recursive all pass structures as will be apparent to one skilled in the relevant arts. $Z^{-2}$ cell 1620 receives the output of adder 1650. Adder 1650 adds the output of $Z^{-2}$ cell 1610 and multiplier 1640, and generates the output of G ($Z^2$) cell 1430.

Figure 17A:
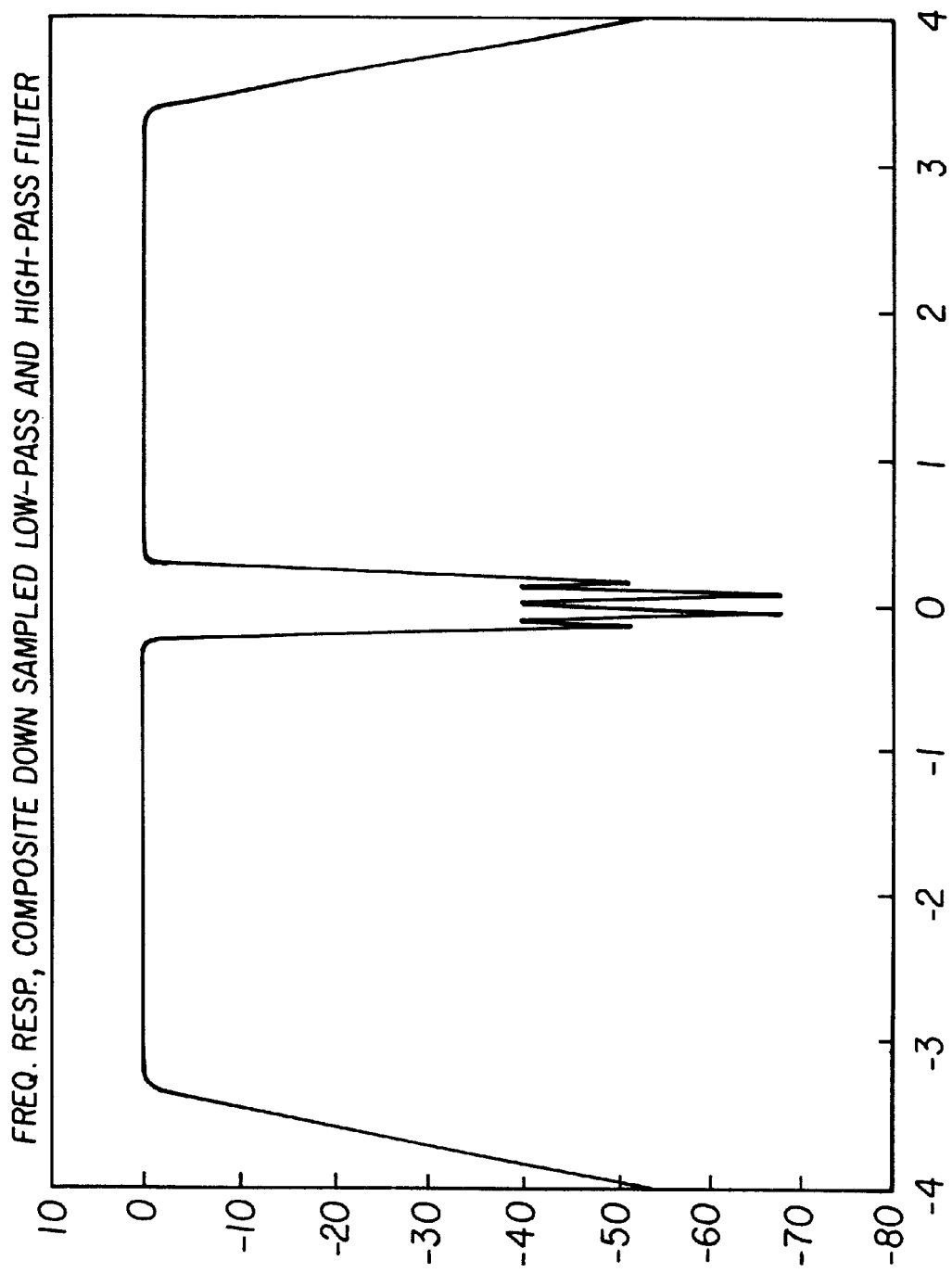
FIG. 17A is a graph illustrating the frequency of the spectral cleanup filter.
Figure 17B:
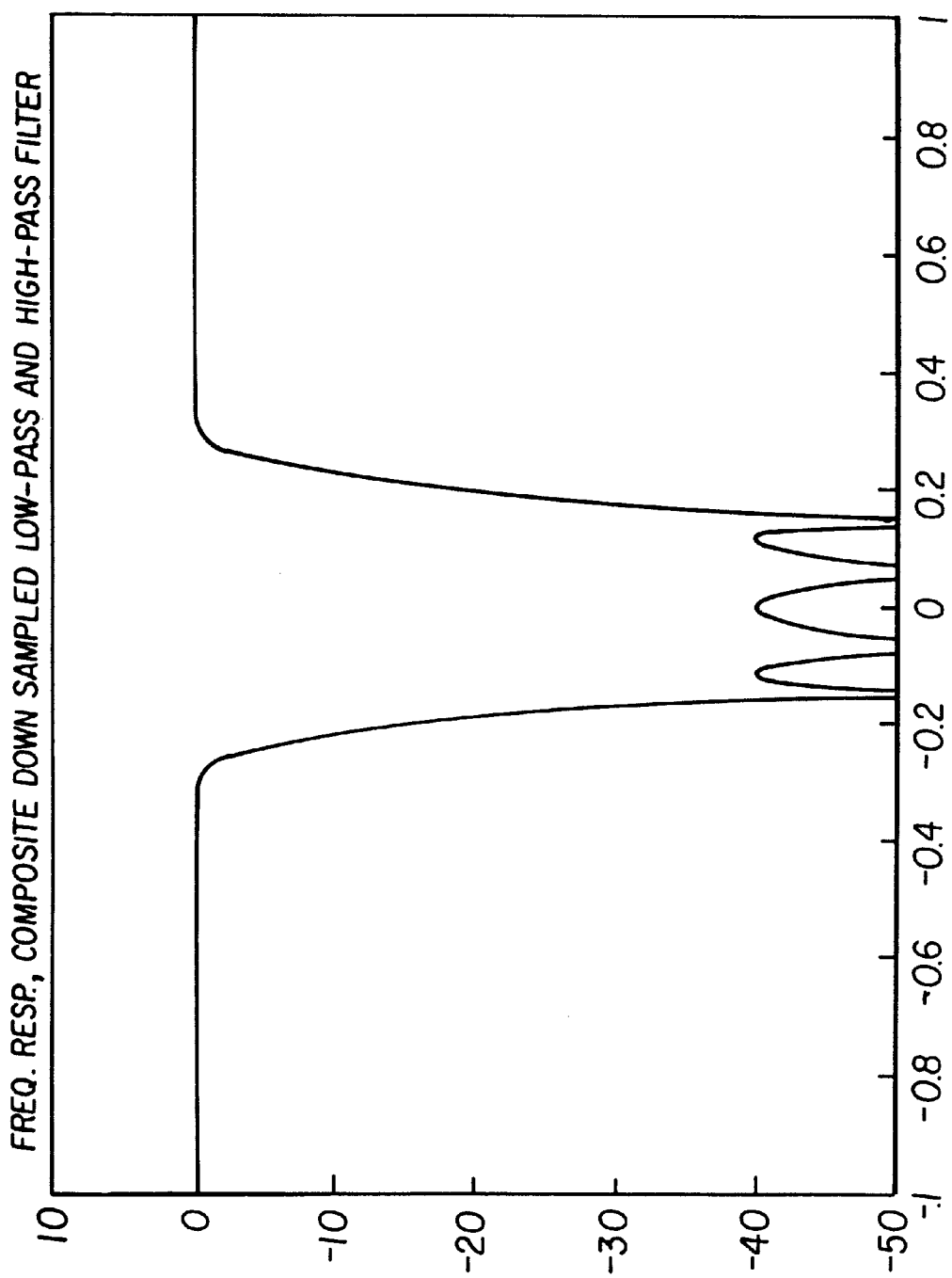
FIG. 17B is a graph illustrating the frequency of the spectral cleanup filter in further detail around the zero frequency.

The description is now continued with combined reference to FIGS. 14, 17A and 17B. FIGS. 17A and 17B together illustrate the frequency response of spectral cleanup filter 250 of FIG. 14B.

Once receive filter 180 provides the filtered data characterized by FIG. 17A or FIG. 13, the digital data encoded in the analog signals received on phone line 151 can be recovered easily, for example, by a computer system using modem 100. In addition, modem 100 may need to transmit data received from the computer system. As noted above, DAC 130 and DAA 150 may be implemented in a known way. An embodiment of transmit filter 110 is described below in further detail.

9. Transmit Filter

Figure 18:
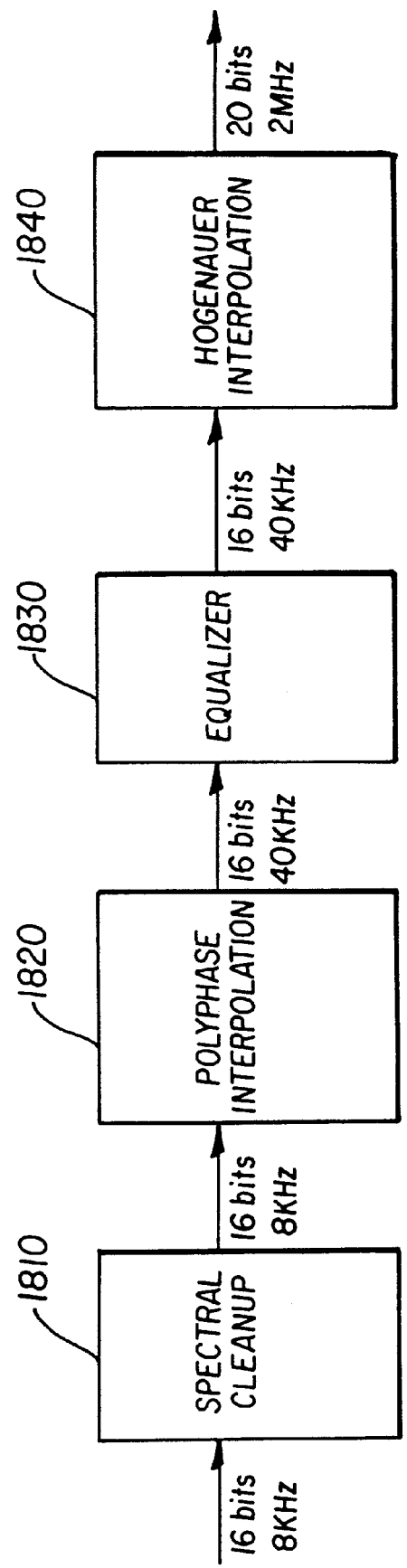
FIG. 18 is a block diagram illustrating the design and operation of an embodiment of transmit filter in one embodiment of the present invention.

FIG. 18 is a block diagram illustrating the design and operation of an embodiment of transmit filter 210. It may be generally noted that the transmit filter is implemented in the reverse order of the processing steps shown in the receive filter. This reversal is called a dual graph. Transmit filter 210 may include spectral cleanup filter 1810, polyphase interpolation filter 1820, equalizer filter 1830, and Hogenauer interpolation filter 1840.

Spectral cleanup filter 1810 may receive 16-bit data at 8 kHz and generate 16-bit filtered data at the same frequency. The spectral response of spectral cleanup filter 1810 may be similar to the response of spectral cleanup filter 250, and thus both filters can be implemented similarly.

In general, spectral cleanup filter 1810 is designed in conjunction with other components in the transmission path to meet a spectral constraint (here to filter components over the 3.4 kHz bandwidth range). Spectral cleanup filter 1810 may be implemented akin to spectral cleanup filter 250 and the description is not repeated here for conciseness.

Polyphase interpolation filter 1820 may receive the 16-bit output data of spectral cleanup filter 1810 and generate 16-bit output data at a higher frequency (e.g., 40 kHz). An embodiment of polyphase interpolation filter 1820 is described below with reference to FIG. 19.

Equalizer filter 1830 may be implemented as a FIR filter with three taps similar to equalizer filter 230 of FIG. 2. Equalizer filter 1830 generates 16-bit data at 40 kHz frequency. Hogenauer interpolation filter 1840 receives the output of equalizer filter 1830 and generates 20 bit data at 2 MHZ. Hogenauer interpolation filter 1840 generates a spectral droop (gradual decrease observed in the spectral response of FIG. 4B in the 0–4 kHz range), and equalizer filter 1830 compensates for the spectral droop. An embodiment of Hogenauer interpolation filter 1840 is described below in further detail.

10. Polyphase Interpolation Filter

Figure 19:
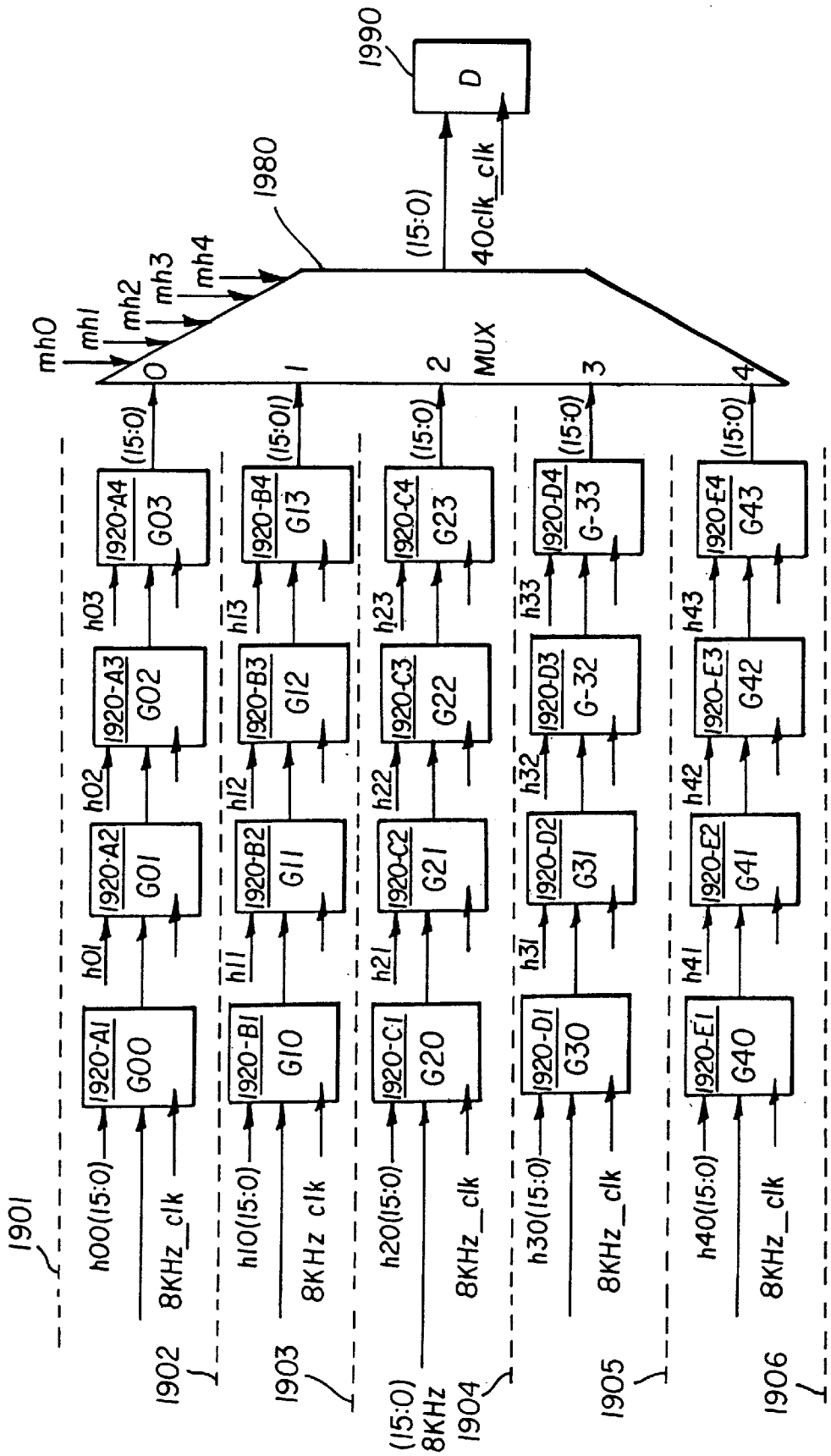
FIG. 19 is a block diagram illustrating the details of an embodiment of polyphase interpolation filter used in the transmit filter.

FIG. 19 is a block diagram illustrating an embodiment of polyphase interpolation filter 1820, containing five phase processors. Polyphase interpolation filter 1820 interpolates the received data and generates the interpolated data at 5-times the input rate. Each phase processor receives a different one of five successive data values received on bus 1812 as illustrated with reference to FIG. 20.

Each of the phase processors may contain four G-cells connected in sequence. Each G-cell may implement the transfer function $G(z)=\{(1-az)/(z-a)\}$ and an embodiment of each cell is described above with reference to FIG. 8 above. Each of the last G-cells (1920-A4, 1920-B4, 1920-C4 and 1920-D4) generates a filtered data value at a rate of 8 kHz.

Multiplexor 1980 operates at 40 kHz and selects the output of one of phase-processors (1910-A through 1910-E) every clock cycle. The output of multiplexor 1980 is provided as an input to equalizer filter 1830. Delay element 1990 may be used an intermediate buffer between the two elements.

Figure 20:
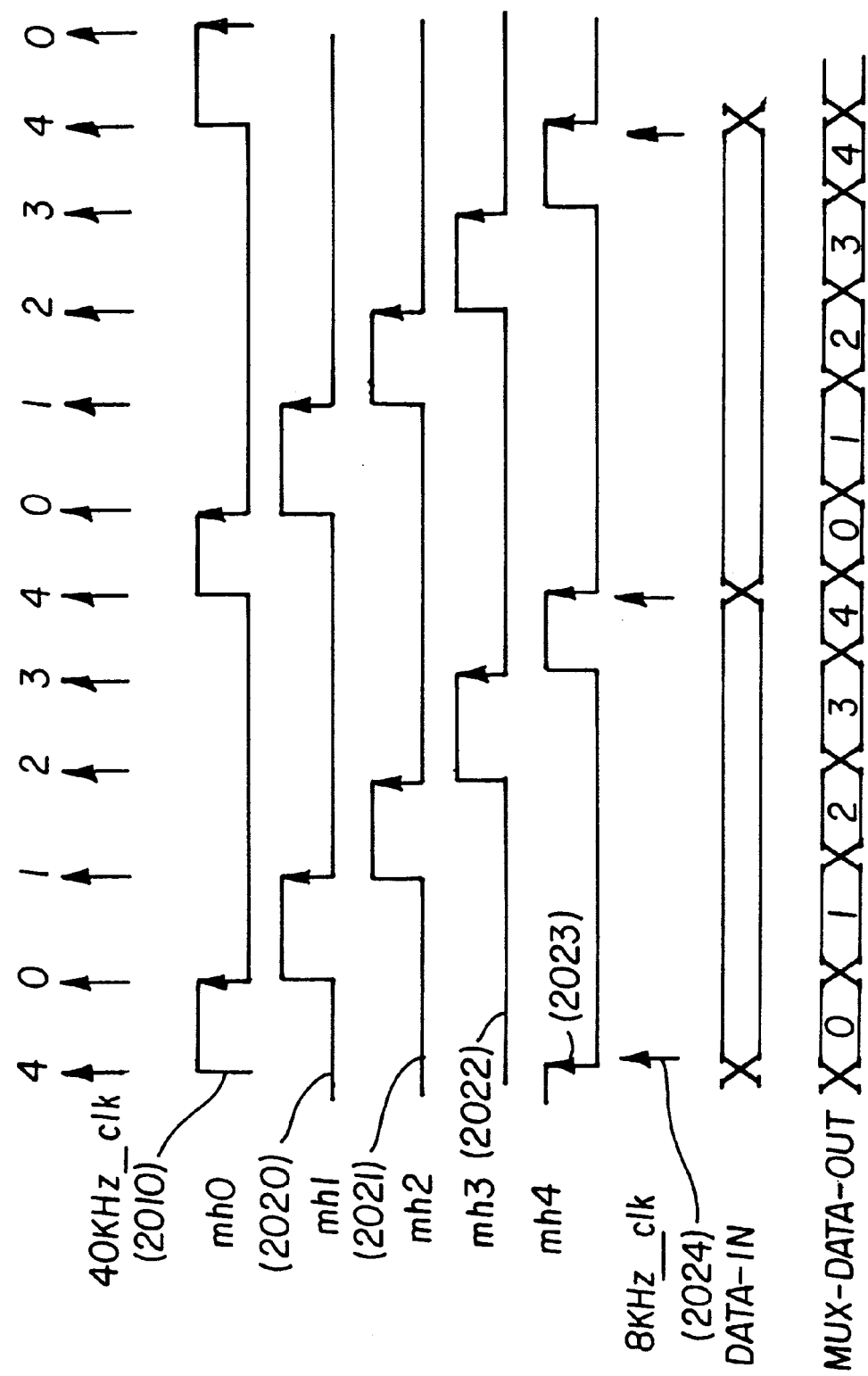
FIG. 20 is a timing diagram illustrating the manner in which different phase processors of the polyphase interpolation processors use different phases of a clock.

FIG. 20 is a timing diagram illustrating different clock signals driving the operation of polyphase interpolation filter 1820. The 40 kHz clock signal 2010 driving the delay element 1990 and multiplexor 1990 is shown at the top. The five 8 kHz clock signals clocking the five phase processors as 2020–2024. Data is shown coming in at 8 kHz rate and data is shown out of multiplexor 1980 at a rate of 40 kHz.

As noted above, the output of polyphase interpolation filter 1820 is provided as an input to equalizer 1830. The output of equalizer 1830 is in turn provided to Hogenauer interpolation filter 1840. An embodiment of Hogenauer interpolation filter 1840 is described below in further detail.

11. Hogenauer Interpolation Filter

Figure 21:
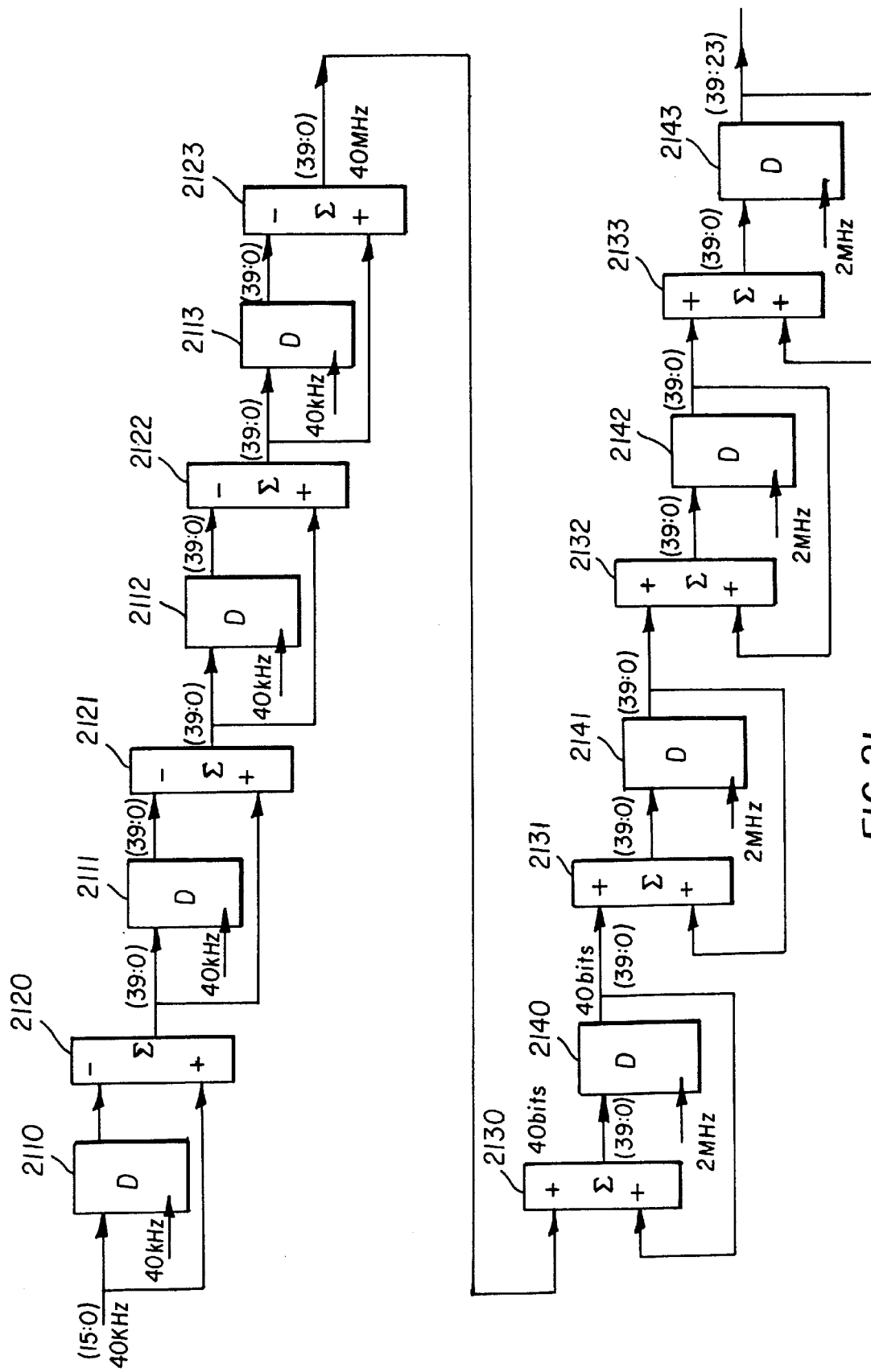
FIG. 21 is a block diagram illustrating the details of Hogenauer interpolation filter in an embodiment of the present invention.

FIG. 21 is a block diagram illustrating an embodiment of Hogenauer interpolation filter 1840 implementing a transfer function similar to that of Hogenauer decimation filter 220. Hogenauer interpolation filter 1840 may contain delay elements 2110–2123 subtractors 2120–2123 operating at 40 kHz, and adders 2130–2133 and delay elements 2140–2143 operating at 2 MHZ. All additions and subtractions may be performed modulo 40, with the carry and borrow bits being ignored. The operation of each element is described below in detail.

Delay element 2110 stores 16 bit data received from equalizer 1830. Subtractor 2120 subtracts the data stored in delay element 2110 from the data received from equalizer 1830 during every clock cycle, and stores the output in delay element 2111. Subtractor 2121 subtracts the data stored in delay element 2111 from the data generated by subtractor 2120, and stores the output in delay element 2112. Subtractor 2122 subtracts the data stored in delay element 2112 from the data generated by subtractor 2121, and stores the output in delay element 2113. Subtractor 2123 subtracts the data stored in delay element 2113 from the data generated by subtractor 2122, and sends the output to adder 2130.

Adder 2130 adds the output received from subtractor 2123 and the data stored in delay element 2140, and stores the result in delay element 2140. Adder 2131 adds the data stored in delay elements 2140 and 2141, and stores the result in delay element 2141. Adder 2132 adds the data stored in delay elements 2141 and 2142, and stores the result in delay element 2142. Adder 2133 adds the data stored in delay elements 2142 and 2143, and stores the result in delay element 2143. Bits 23–39 are provided as the 16-bit output of transmit filter 110 on bus 112. Transmit modulator 120, DAC/filter 130, and DAA 150 may together operate to transmit the output bits in analog form on telephone line 151.

Thus, modem 100 provided in accordance with the present invention can be used in various systems to receive and transmit data, for example, in analog form on telephone lines. Modem 100 can be used external to a system or internal to a system. The systems may include a computer system and a television system. An example embodiment of television system using the modem of the present invention is described below in further detail.

12. Television System

Figure 22:
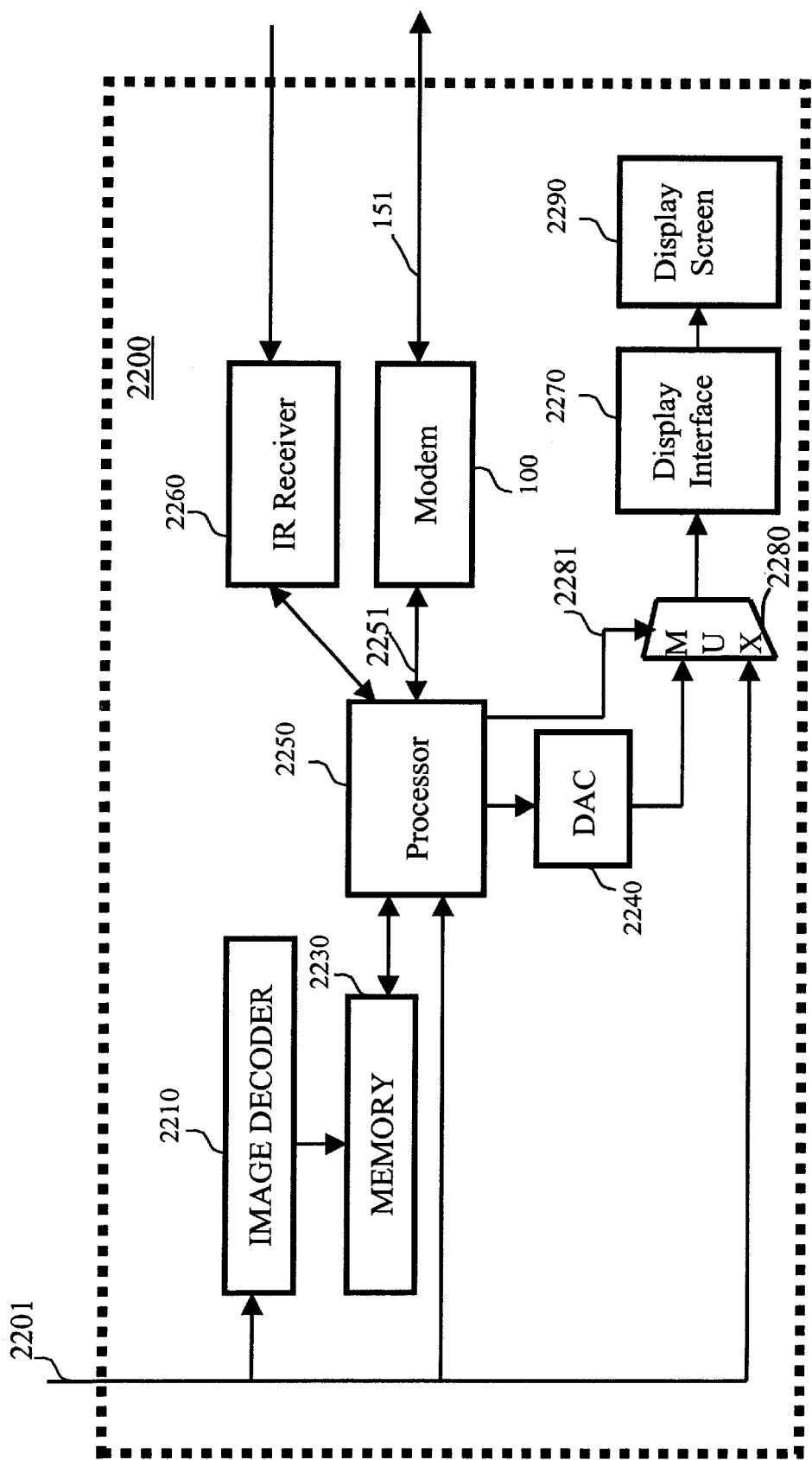
FIG. 22 is a block diagram illustrating the use of a modem in a system (such as television system) in accordance with the present invention.

FIG. 22 is a block diagram illustrating the internals of an example embodiment of television system 2200, which enables a viewer to access various data (e.g., web pages) and services from enhanced broadcast providers. Television system may contain image decoder 2210, memory 2230, processor 2250, digital to analog converter (DAC) 2240, multiplexor 2280, infra-red (IR) receiver 2260, modem 100 and broadband interface 2275. The operation of each component is described below in further detail.

Image decoder 2210 generates pixel data elements representing image frames encoded in a television signal received on broadcast channel 2201. In response to the reception of remote control signals on IR receiver 2260 from a remote control unit (not shown), image decoder 2210 may store the pixel data elements representing an image frame in memory 2230. Such storage enables overlays. Image decoder 2210 may be implemented in a known way.

Memory 2230 may represent several memory modules such as fast random access memories and relatively slower non-volatile memories. The non-volatile memories may store data and program instructions which enable the operation of the present invention. Memory 2230 may store data representing several surfaces, which are overlaid to generate an image on display screen 2290. Example surfaces (and the manner in which they may be overlaid) are described in further detail in co-pending Patent application entitled, "A Method and Apparatus for Enabling a User to Access Data Network Applications from a Television System", Filed Jun. 2, 1997, Ser. No. 08/867,203 (hereafter "RELATED APPLICATION 1"), and is incorporated in its entirety herewith.

Infra-red (IR) receiver 2260 receives remote control signals and provides digital data representing the remote control signals to processor 2250. The control signals may indicate whether the user wishes to access data on a remote system (not shown) using modem 100, in which case, processor 2250 may generate the necessary commands on modem 100 to setup the connection with the remote system and transfer the requested data. Modem 100 enables a telephone call to be initiated on telephone line 151. Such telephone calls may be initiated, for example, to connect to the Internet via an ISP.

Once the connection is setup, data may be transferred from and to television system 2200. Processor 2250 may send and receive data on bus 2251 (corresponding to both 101 and 191 of FIG. 1). Processor 2250 recovers the data encoded in signal received on a telephone line by examining the input data received on bus 2251. The recovery may be implemented in a known way. Similarly, processor may transfer any desired data on bus 2251, and modem 100 encodes the received data in an analog signal for transmission on telephone line 151.

Processor 2250 enables the images ("data images") representing the data received on modem 100 to be displayed along with images ("television images") encoded. Processor 2250 generates such images by overlaying the two images to generate a overlaid image. Some of the data images correspond to web pages accessed from the world-wide web. Pixel data elements (in digital form) representing the overlaid image are sent to multiplexor 2280, and processor 2250 controls multiplexor select line 2281 to cause multiplexor 2280 select either the television signal display data (contained in 2201) or the overlaid image (in analog form).

For a suitable user-interface, processor 2250 may control the images displayed on television system 110. For example, to enable web browsing, processor 2250 may need to generate a 'pointer display', which can be used by a viewer to select various hyperlinks encoded in a received web page. Image representations of the web page, pointer display, and data images may be stored in memory 2230, and processor 2250 may generate the corresponding overlaid display. The output of DAC 2240 is provided as the output of multiplexor 2280 by the control of line 2281.

Display interface 2270 may receive the output of multiplexor 2280 and generate signals consistent with the interface requirements of display screen 2290. Display interface 2270 and display screen 2290 may be implemented in a known way. Thus, using a modem provided in accordance with the present invention several types of systems such as television systems and computer systems may be able to send and receive data on a telephone line.

13. Conclusion

While various embodiments of the present invention have been described above, it should be understood that they have been presented by way of example only, and not limitation. Thus, the breadth and scope of the present invention should not be limited by any of the above-describe exemplary embodiments, but should be defined only in accordance with the following claims and their equivalents.

What is claimed is:

1. A low pass receive filter for filtering high frequency components from an input signal represented by a digital data stream, said digital data stream containing a plurality of digital data elements, with each digital data element containing a small number of bits, said low pass filter comprising:

a converter to receive said digital data stream and to generate as output an integer in the interval K to −K, wherein K is an integer representing the range of the final output data stream;

a Hogenauer decimating filter coupled to said converter, said Hogenauer decimating filter to decimate the output of said converter to generate a decimated output, wherein said decimated output exhibits a non-flat pass-band spectral amplitude response;

an equalizer filter coupled to said Hogenauer decimating filter, said equalizer to process said decimated output to flatten said non-flat pass-band spectral amplitude response;

a polyphase decimation filter coupled to said equalizer, said polyphase decimation filter to process the output of said equalizer filter; and a spectral cleanup filter coupled to said polyphase decimation filter, said spectral cleanup filter to process the output of said decimation filter to modify the spectrum at band edges of said decimating filter.

2. The low pass receive filter of claim 1, wherein said converter receives a binary input having two logical states and wherein said converter generates +K in response to one logical state, and a −K in response to the other logical state.

3. The low pass receive filter of claim 1, wherein said Hogenauer decimating filter implements a decimating cascade-integrator-comb filter with pre-decimating transfer function of the form $[\{(1/M)(1-Z^{-M})/(1-Z^{-1})\}]^N$, wherein M is an integer representing the decimation factor and N is an integer representing the number of cascade stages.

4. The low pass receive filter of claim 3, wherein N is selected to be 4 and M is selected to be 50.

5. The low pass receive filter of claim 3, wherein said Hogenauer decimating filter receives a 28-bit binary number representing the said ±K as an input at a sample frequency of 2 MHZ and processes and decimates the input by a factor of 50 to generate 16-bit output at a frequency of 40 kHz.

6. The low pass filter of claim 1, wherein said equalizer filter is implemented as a three tap FIR filter.

7. The low pass receive filter of claim 1, wherein said polyphase decimating filter comprises a plurality of recursive all-pass processors, with each all-pass processor processing data elements formed at the separate ports or phases of a commutated partition of the output of said equalizer.

8. The low pass receive filter of claim 7, wherein said polyphase decimation filter comprises all-pass processors on five paths or filter phases, and said polyphase decimation filter receives data at 40 kHz and generates output at 8 kHz.

9. The low pass receive filter of claim 7, wherein said all-pass processors in each path or phase is implemented as a cascade of recursive filters with pre-decimation transfer functions of the form $\{(1+a_{ij}Z^2)/(Z^2+a_{ij})\}$, wherein the $a_{ij}$ are scalar coefficients, and wherein the i-index defines the path, and the j index defines the filter in that path.

10. The low pass receive filter of claim 1, wherein said spectral cleanup filter is implemented as a two path, non-decimating filter in which each path or phase is implemented as a plurality of recursive filters with transfer function of the form $\{(1+a_{ij}Z^2+b_{ij}Z^4)/(Z^4+a_{ij}Z^2+b_{ij})\}$, wherein the $a_{ij}$ and $b_{ij}$ are scalar coefficients, and wherein the i-index defines the path, and the j index defines the filter in that path.

11. A low pass transmit filter for generating a high frequency output digital data stream representing samples of a low pass signal from a lower frequency input sampled digital data stream, wherein each of said high frequency output digital data stream and said lower frequency input sampled digital data stream comprises a plurality of data elements, wherein each data element in said lower frequency data stream contains more number of bits than the data elements in said high frequency digital data stream, said high frequency digital data stream representing samples of a low pass signal suitable for transmission on a telephone line, said transmit filter comprising;

a spectral cleanup filter to process lower frequency digital data so that the spectrum of the lower frequency digital data meets a spectral mask constraint at the band edges;

a polyphase interpolating filter coupled to the output of the spectral clean up filter;

a pre-equalizer filter coupled to said polyphase interpolating filter;

a Hogenauer interpolating filter coupled to said pre-equalizer filter, said Hogenauer interpolating filter increasing the sample rate of said equalizer filter, wherein said pr-equalizer pre-distorts the amplitude spectrum obtained from said polyphase interpolating filter to compensate for the spectral droop generated by said Hogenauer interpolating filter; and a converter to receive a digital data stream from said Hogenauer filter, said data stream being composed of data words extending over a large number of bits, said converter to receive said digital data stream and generating as output an integer +K or −K, where K is an integer representing the range of the input data stream.

12. The low pass transmit filter of claim 11, wherein said spectral cleanup filter is implemented as a two path, non-decimating filter in which each path is implemented as a recursive filter with transfer function of the form $\{(1+a_{ij}Z^2+b_{ij}Z^4)/(Z^4+a_{ij}Z^2+b_{ij})\}$, wherein $a_{ij}$ and $b_{ij}$ are scalar coefficients with i and j representing indexes, and wherein the i-index defines the path, and the j index defines the filter in that path.

13. The low pass transmit filter of claim 11, wherein said polyphase interpolating filter comprises all-pass processors on five paths or filter phases, and said polyphase decimation filter receives data at 8 kHz and generates output at 40 kHz.

14. The low pass transmit filter of claim 11, wherein said all-pass processors in each path or phase is implemented as a cascade of recursive filters with pre-interpolated transfer functions of the form $\{(1+a_{ij}Z^2)/(Z^2+a_{ij})\}$, wherein the $a_{ij}$ are scalar coefficients with i and j representing indexes, and wherein the i-index defines the path, and the j index defines the filter in that path.

15. The low pass filter of claim 11, wherein said equalizer filter is implemented as a three tap FIR filter.

16. The low pass receive filter of claim 1, wherein said Hogenauer interpolating filter implements an interpolating cascade-integrator-comb filter with pre-interpolated transfer function of the form $[\{(1/M)(1-Z^{-M})/(1-Z^{-1})\}]^K$, wherein M is an integer representing the decimation factor and K is an integer representing the number of cascade stages.

17. The low pass transmit filter of claim 11, wherein K is selected to be 4 and M is selected to be 50.

18. The low pass transmit filter of claim 11, wherein said Hogenauer interpolating filter receives a 16-bit binary representing samples in the range ±K as an input at a sample frequency of 40 KHZ and processes and interpolates the input by a factor of 50 to generate a 28-bit output words at a frequency of 2.0 MHZ.

19. The low pass transmit filter of claim 11, further comprising a comparator to generate a stream of bits, each with two logical states, wherein said converter generates +K in response to receiving a first logical state, and a −K in response to receiving a second logical state.

20. The low pass receive filter of claim 7, wherein said polyphase decimating filter contains a number of paths not restricted to be a power of 2.

21. The invention of claim 1, wherein said low pass receive filter is implemented in a modem of a television system.

22. The invention of claim 11, wherein said low pass transmit filter is implemented in a television system.

23. A system comprising:

a memory;

a processor coupled to said memory, said processor causing a plurality of data elements to be stored in said memory; and a modem coupled to said processor, said modem generating said plurality of data elements, said modem comprising:

a data access arrangement to generate signals proportionate to the strength of analog signals received on a phone line;

an analog to digital converter (ADC) to sample said signals generated by said data access arrangement to generate a first data stream containing a plurality of multi-bit digital values;

a receive demodulator generating a second data stream based on said first data stream, wherein said second data stream contains a plurality of single-bit digital values; and a low pass receive filter for filtering high frequency components from an input signal represented by said second data stream, said low pass filter comprising:

a converter to receive said second data stream and to generate as output an integer in the interval K to −K, wherein K is an integer representing the range of the final output data stream;

a Hogenauer decimating filter coupled to said converter, said Hogenauer decimating filter to decimate the output of said converter to generate a decimated output, wherein said decimated output exhibits a non-flat pass-band spectral amplitude response;

an equalizer filter coupled to said Hogenauer decimating filter, said equalizer to process said decimated output to flatten said non-flat pass-band spectral amplitude response;

a polyphase decimation filter coupled to said equalizer, said polyphase decimation filter to process the output of said equalizer filter; and a spectral cleanup filter coupled to said polyphase decimation filter, said spectral cleanup filter to process the output of said decimation filter to modify the spectrum at band edges of said decimating filter.

24. The system of claim 23, wherein said converter receives a binary input having two logical states and wherein said converter generates +K in response to one logical state, and a −K in response to the other logical state.

25. The system of claim 23, wherein said Hogenauer decimating filter implements a decimating cascade-integrator-comb filter with pre-decimating transfer function of the form $[\{(1/M)(1-Z^{-M})/(1-Z^{-1})\}]^N$, wherein M is an integer representing the decimation factor and N is an integer representing the number of cascade stages.

26. The system of claim 25, wherein N is selected to be 4 and M is selected to be 50.

27. The system of claim 25, wherein said Hogenauer decimating filter receives a 28-bit binary number representing the said ±K as an input at a sample frequency of 2 MHz and processes and decimates the input by a factor of 50 to generate 16-bit output at a frequency of 40 kHz.

28. The low pass filter of claim 23, wherein said equalizer filter is implemented as a three tap FIR filter.

29. The system of claim 23, wherein said polyphase decimating filter contains a number of paths not restricted to be a power of 2, and wherein said polyphase decimating filter comprises a plurality of recursive all-pass processors, with each all-pass processor processing data elements formed at the separate ports or phases of a commutated partition of the output of said equalizer.

30. The system of claim 29, wherein said polyphase decimation filter comprises all-pass processors on five paths or filter phases, and said polyphase decimation filter receives data at 40 kHz and generates output at 8 kHz.

31. The system of claim 30, wherein said all-pass processors in each path or phase is implemented as a cascade of recursive filters with pre-decimation transfer functions of the form $\{(1+a_{ij}Z^2)/(Z^2+a_{ij})\}$, wherein the aij are scalar coefficients, and wherein the i-index defines the path, and the j index defines the filter in that path.

32. The system of claim 23, wherein said spectral cleanup filter is implemented as a two path, non-decimating filter in which each path or phase is implemented as a plurality of recursive filters with transfer function of the form $\{(1+a_{ij}Z^2+b_{ij}Z^4)/(Z^4+a_{ij}Z^2+b_{ij})\}$, wherein the aij and bij are scalar coefficients, and wherein the i-index defines the path, and the j index defines the filter in that path.

33. The invention of claim 22, wherein said system comprises a television system.

34. A system comprising:

a memory storing a plurality of data elements;

a processor coupled to said memory, said processor causing said plurality of data elements to be transmitted on a line; and a modem coupled to said processor, said modem for transmitting said plurality of data elements on said line, said modem comprising a low pass it filter for generating a high frequency output digital data stream representing samples of a low pass signal from a lower frequency input sampled digital data stream, wherein each of said high frequency output digital data stream and said lower frequency input sampled digital data stream comprises a plurality of data elements, wherein each data element in said lower frequency data stream contains more number of bits than the data elements in said high frequency digital data stream, said high frequency digital data stream representing samples of a low pass signal suitable for transmission on a telephone line, said low pass transmit filter comprising;

a spectral cleanup filter to process lower frequency digital data so that the spectrum of the lower frequency digital data meets a spectral mask constraint at the band edges;

a polyphase interpolating filter coupled to the output of the spectral clean up filter;

a pr-equalizer filter coupled to said polyphase interpolating filter;

a Hogenauer interpolating filter coupled to said pre-equalizer filter, said Hogenauer interpolating filter increasing the sample rate of said equalizer filter, wherein said pre-equalizer pre-distorts the amplitude spectrum obtained from said polyphase interpolating filter to compensate for the spectral droop generated by said Hogenauer interpolating filter; and a converter to receive a digital data stream from said Hogenauer filter, said data stream being composed of data words extending over a large number of bits, said converter to receive said digital data stream and generating as output an integer +K or −K, where K is an integer representing the range of the input data stream.

35. The system of claim 34, wherein said spectral cleanup filter is implemented as a two path, non-decimating filter in which each path is implemented as a recursive filter with transfer function of the form $\{(1+a_{ij}Z^2+b_{ij}Z^4)/(Z^4+a_{ij}Z^2+b_{ij})\}$, wherein $a_{ij}$ and $b_{ij}$ are scalar coefficients with i and j representing indexes, and wherein the i-index defines the path, and the j index defines the filter in that path.

36. The system of claim 34, wherein said polyphase interpolating filter comprises all-pass processors on five paths or filter phases, and said polyphase decimation filter receives data at 8 kHz and generates output at 40 kHz.

37. The system of claim 34, wherein said all-pass processors in each path or phase is implemented as a cascade of recursive filters with pre-interpolated transfer functions of the form $\{(1+a_{ij}Z^2)/(Z^2+a_{ij})\}$, wherein the $a_{ij}$ are scalar coefficients with i and j representing indexes, and wherein the i-index defines the path, and the j index defines the filter in that path.

38. The system of claim 34, wherein said equalizer filter is implemented as a three tap FIR filter.

39. The system of claim 34, wherein said Hogenauer interpolating filter implements an interpolating cascade-integrator-comb filter with pre-interpolated transfer function of the form $[\{(1/M)(1-Z^{-M})/(1-Z^{-})\}]^K$, wherein M is an integer representing the decimation factor and K is an integer representing the number of cascade stages.

40. The system of claim 39, wherein K is selected to be 4 and M is selected to be 50.

41. The system of claim 34, wherein said Hogenauer decimating filter receives a 16-bit binary representing samples in the range ±K as an input at a sample frequency of 40 KHZ and processes and interpolates the input by a factor of 50 to generate a28-bit output words at a frequency of 2.0 MHZ.

42. The system of claim 34, ether comprising a comparator to generate a stream of bits, each with two logical states, wherein said converter generates +K in response to receiving a first logical state, and −K in response to receiving a second logical state.

43. The invention of claim 34, wherein said system comprises a television system.

* * * * *